(12) United States Patent
Hwang et al.

(10) Patent No.: US 12,261,104 B2
(45) Date of Patent: Mar. 25, 2025

(54) SEMICONDUCTOR PACKAGE AND METHOD OF FABRICATING THE SAME

(71) Applicant: Samsung Electronics Co., Ltd., Suwon-si (KR)

(72) Inventors: Hyeonjeong Hwang, Cheonan-si (KR); Dongkyu Kim, Anyang-si (KR); Minjung Kim, Cheonan-si (KR); Yeonho Jang, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 455 days.

(21) Appl. No.: 17/670,635

(22) Filed: Feb. 14, 2022

(65) Prior Publication Data

US 2022/0415771 A1    Dec. 29, 2022

(30) Foreign Application Priority Data

Jun. 29, 2021    (KR) .................. 10-2021-0085055

(51) Int. Cl.
*H01L 23/498*    (2006.01)
*H01L 23/00*    (2006.01)
*H01L 23/31*    (2006.01)
*H01L 25/065*    (2023.01)

(52) U.S. Cl.
CPC .... *H01L 23/49816* (2013.01); *H01L 23/3128* (2013.01); *H01L 23/49822* (2013.01); *H01L 24/16* (2013.01); *H01L 25/0655* (2013.01); *H01L 2224/16227* (2013.01)

(58) Field of Classification Search
CPC .......... H01L 23/49816; H01L 23/3128; H01L 23/49822; H01L 24/16; H01L 25/0655; H01L 2224/16227; H01L 2221/68345; H01L 2225/1023; H01L 2225/1041; H01L 2225/1058; H01L 21/568; H01L 25/105; H01L 21/6835; H01L 23/485; H01L 24/02; H01L 2224/02331; H01L 2224/02333; H01L 2224/0401
See application file for complete search history.

(56) References Cited

U.S. PATENT DOCUMENTS

| | | |
|---|---|---|
| 8,865,586 B2 | 10/2014 | Wu et al. |
| 9,704,781 B2 | 7/2017 | Wirz et al. |
| 10,090,255 B2 | 10/2018 | Hedrick et al. |
| 10,147,692 B2 | 12/2018 | Chen et al. |
| 10,269,701 B2 | 4/2019 | Lu et al. |

(Continued)

*Primary Examiner* — Jonathan Han
(74) *Attorney, Agent, or Firm* — Muir Patent Law, PLLC

(57) ABSTRACT

A semiconductor package including a redistribution substrate extending in a first direction and a second direction perpendicular to the first direction, a semiconductor chip mounted on a top surface of the redistribution substrate, and an outer terminal on a bottom surface of the redistribution substrate. The redistribution substrate may include an under-bump pattern, a redistribution insulating layer covering a top surface and a side surface of the under-bump pattern, a protection pattern interposed between the top surface of the under-bump pattern and the redistribution insulating layer, and interposed between the side surface of the under-bump pattern and the redistribution insulating layer, and a redistribution pattern on the under-bump pattern. The outer terminal may be disposed on a bottom surface of the under-bump pattern.

20 Claims, 16 Drawing Sheets

(56) References Cited

U.S. PATENT DOCUMENTS

| | | |
|---|---|---|
| 10,347,774 B2 | 7/2019 | Kishi et al. |
| 10,559,525 B2 | 2/2020 | Yu |
| 2005/0017355 A1* | 1/2005 | Chou .................. H01L 24/13 |
| | | 257/E23.021 |
| 2021/0057347 A1* | 2/2021 | Liu ..................... H01L 24/82 |

* cited by examiner

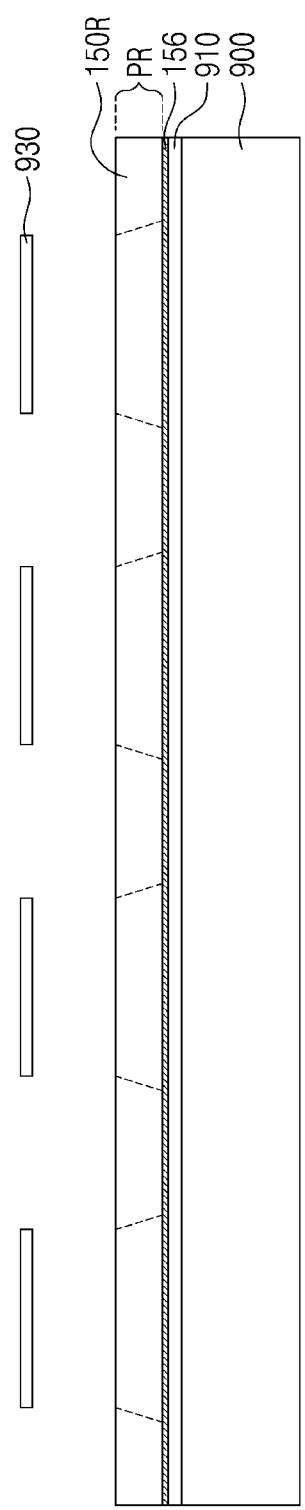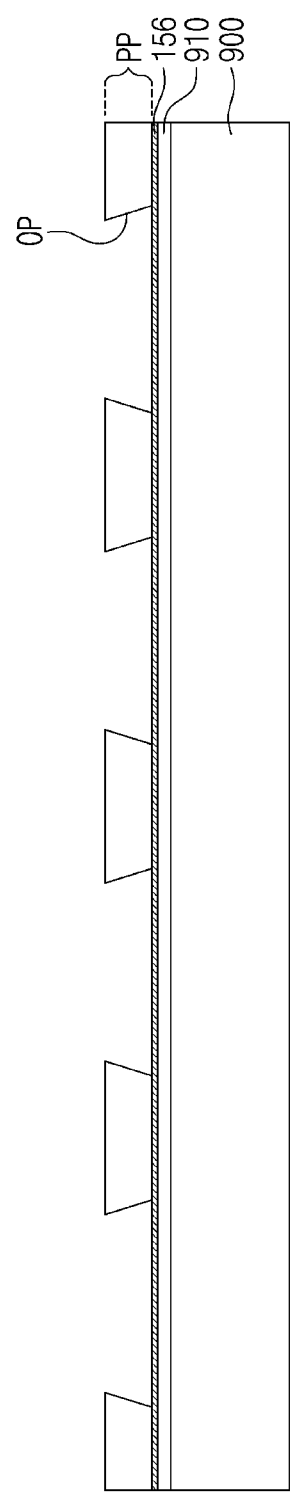

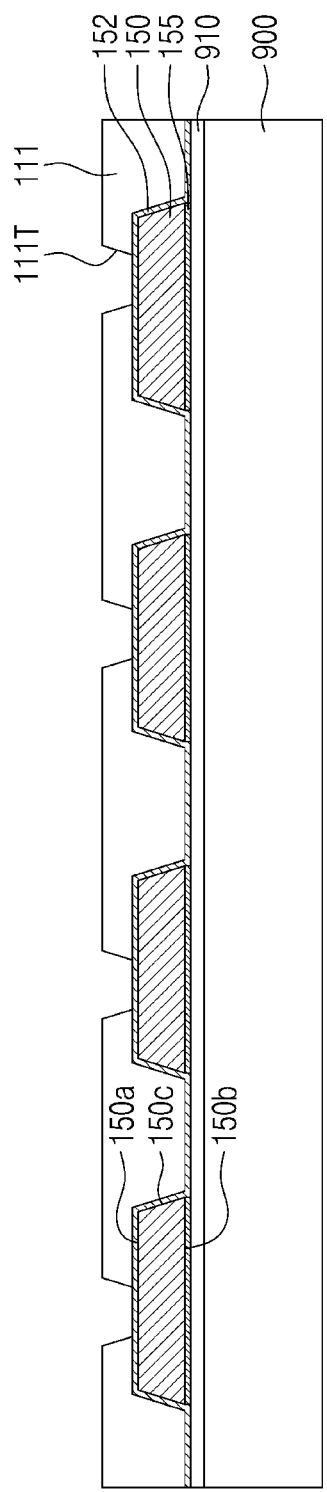
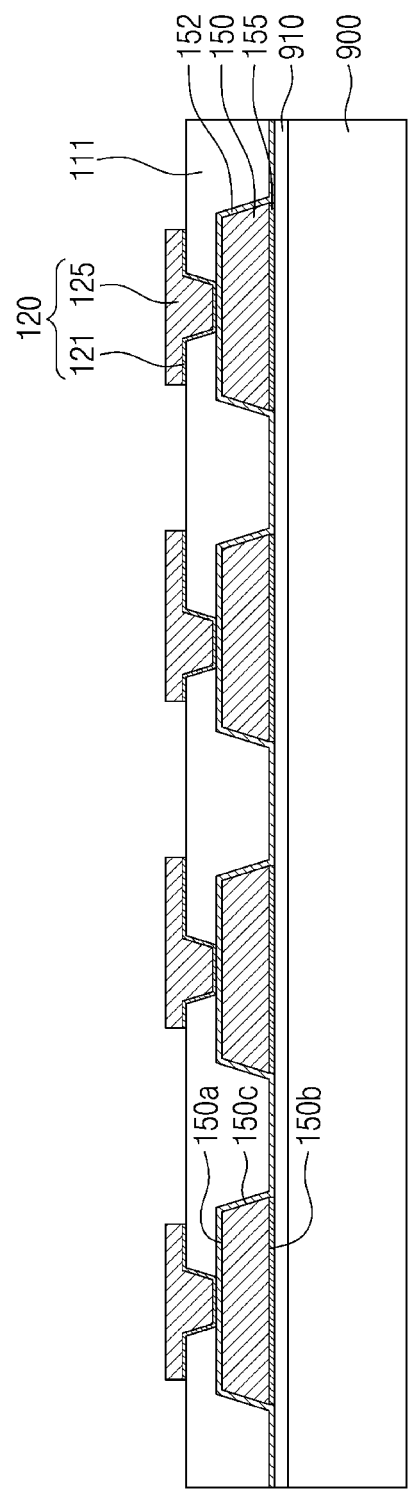

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0085055, filed on Jun. 29, 2021, in the Korean Intellectual Property Office, the entire contents of which are hereby incorporated by reference.

BACKGROUND OF THE INVENTION

The present disclosure relates to a semiconductor package and a method of manufacturing the same, and in particular, to a semiconductor package including a redistribution substrate and a method of manufacturing the same.

A semiconductor package is configured to easily use a semiconductor chip as a part of an electronic product. Conventionally, the semiconductor package includes a printed circuit board (PCB) and a semiconductor chip, which is mounted on the PCB and is electrically connected to the PCB using bonding wires or bumps. With development of electronics industry, many studies are being conducted to improve reliability of the semiconductor package and to reduce a size of the semiconductor package.

SUMMARY

An embodiment of the inventive concept provides a semiconductor package with improved reliability.

An embodiment of the inventive concept provides a method of fabricating a semiconductor package with improved reliability.

According to an embodiment of the inventive concept, a semiconductor package may include a redistribution substrate extending in a first direction and a second direction perpendicular to the first direction, a semiconductor chip mounted on a top surface of the redistribution substrate, and an outer terminal on a bottom surface of the redistribution substrate. The redistribution substrate may include an under-bump pattern, a redistribution insulating layer covering a top surface and a side surface of the under-bump pattern, a protection pattern interposed between the top surface of the under-bump pattern and the redistribution insulating layer, and interposed between the side surface of the under-bump pattern and the redistribution insulating layer, and a redistribution pattern on the under-bump pattern. The outer terminal may be disposed on a bottom surface of the under-bump pattern.

According to an embodiment of the inventive concept, a semiconductor package may include a redistribution substrate extending in a first direction and a second direction perpendicular to the first direction, a first semiconductor chip mounted on a top surface of the redistribution substrate, and an outer terminal on a bottom surface of the redistribution substrate. The redistribution substrate may include an under-bump pattern, an angle between a bottom surface of the under-bump pattern and a side surface of the under-bump pattern being an acute angle, a redistribution insulating layer covering a top surface and a side surface of the under-bump pattern, a redistribution pattern on the under-bump pattern, the redistribution pattern including a via portion and a wire portion on the via portion, a protection pattern interposed between the top surface of the under-bump pattern and the redistribution insulating layer, and interposed between the side surface of the under-bump pattern and the redistribution insulating layer, and a pad structure on the redistribution pattern.

According to an embodiment of the inventive concept, a method of fabricating a semiconductor package may include forming an under-bump pattern on a lower seed layer, removing a portion of the lower seed layer exposed by the under-bump pattern to form a lower seed pattern, forming a protection layer on the under-bump pattern to cover side surfaces of the lower seed pattern, a top surface of the under-bump pattern, and side surfaces of the under-bump pattern, forming a redistribution insulating layer on the protection layer, forming a redistribution pattern, which is coupled to the protection layer, in the redistribution insulating layer, electrically connecting a chip pad of a semiconductor chip to the redistribution pattern, removing the lower seed pattern to expose a bottom surface of the under-bump pattern, and forming an outer terminal on the bottom surface of the under-bump pattern.

BRIEF DESCRIPTION OF THE DRAWINGS

FIGS. 3 to 14 are sectional views illustrating a method of fabricating a semiconductor package according to an embodiment of the inventive concept.

DETAILED DESCRIPTION

Example embodiments of the inventive concepts will now be described more fully with reference to the accompanying drawings, in which example embodiments are shown.

Figure 1:
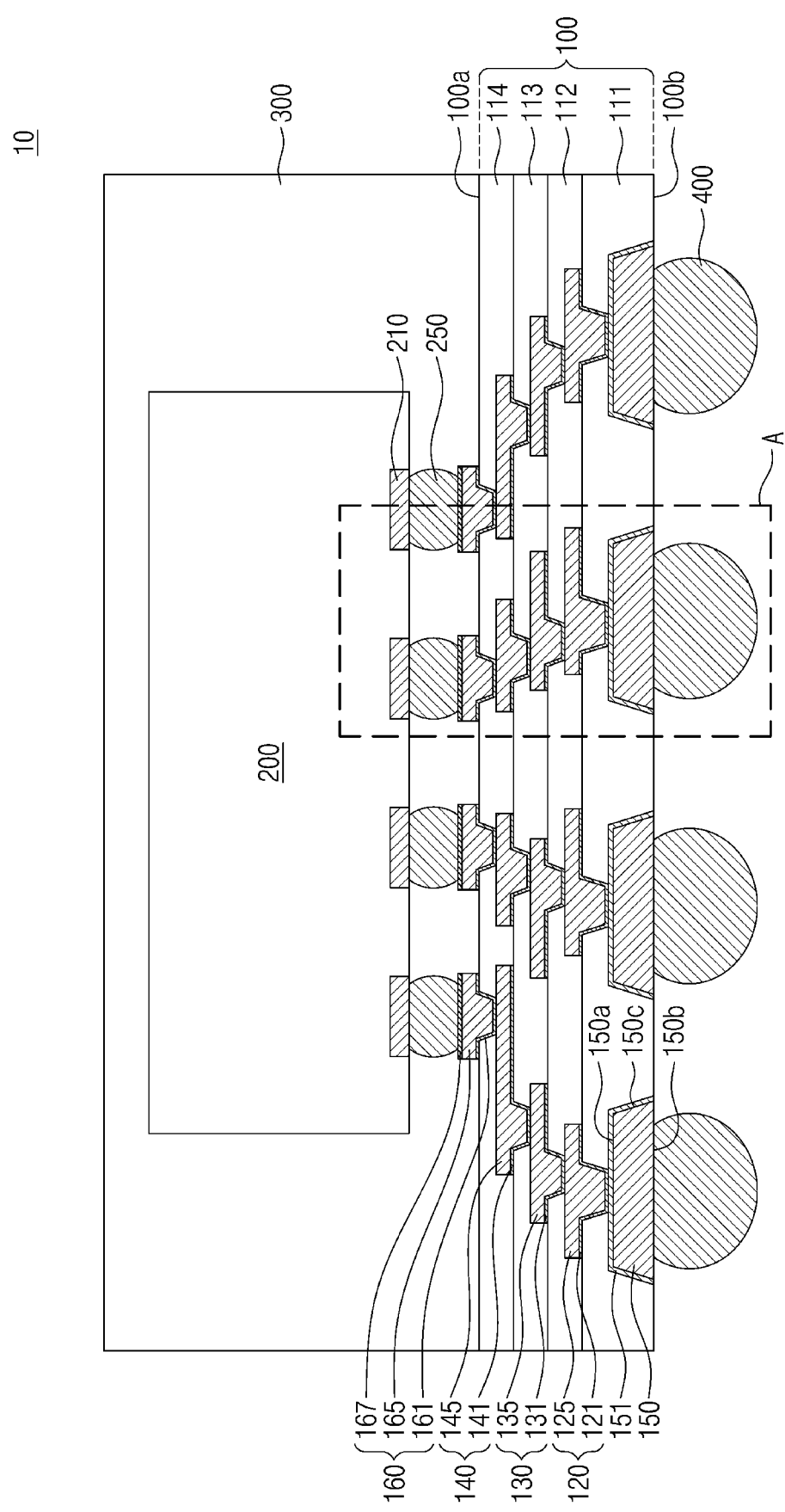
FIG. 1 is a sectional view illustrating a semiconductor package according to an embodiment of the inventive concept.
Figure 2:
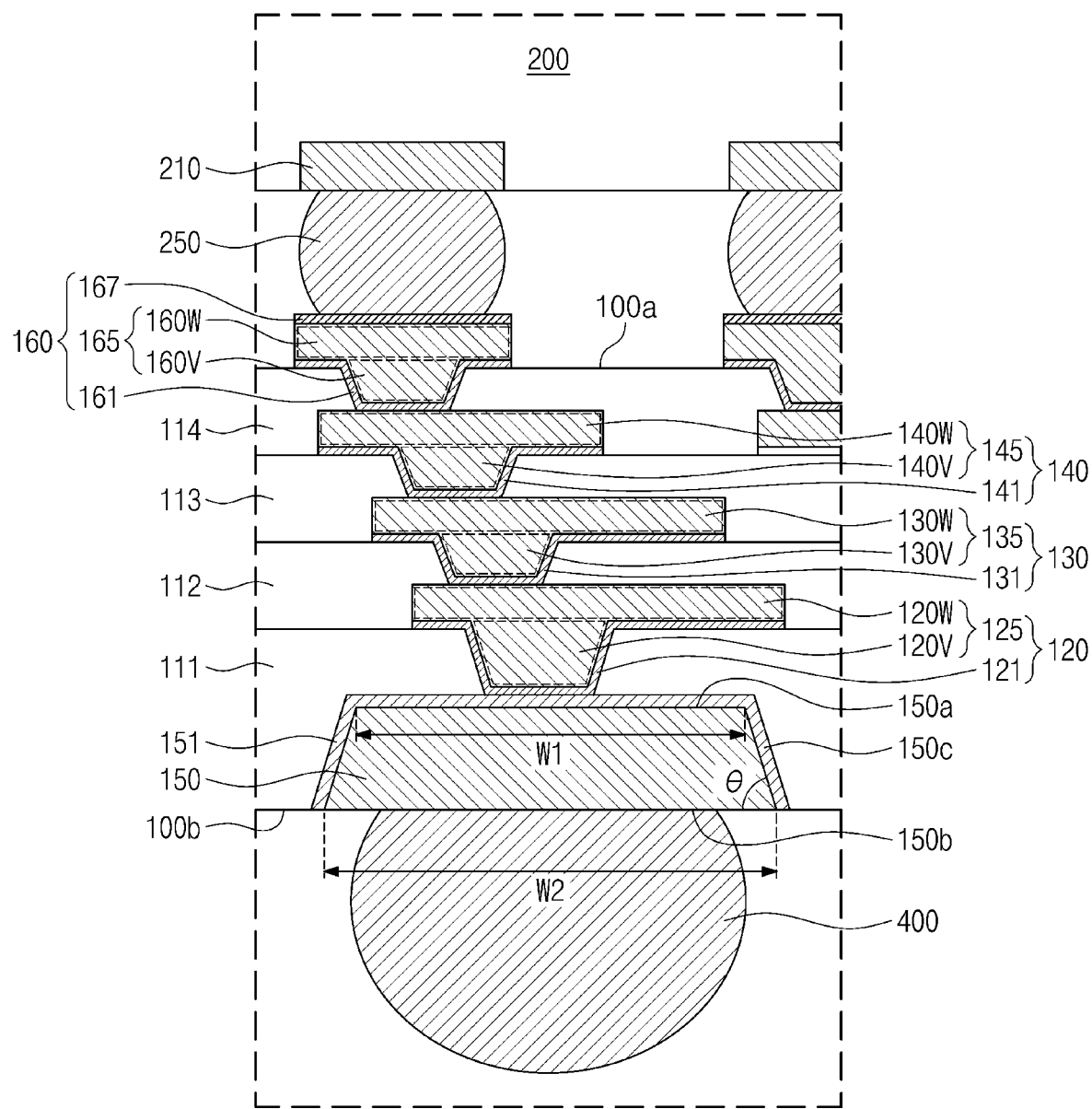
FIG. 2 is an enlarged sectional view illustrating a portion 'A' of FIG. 1.

FIG. 1 is a sectional view illustrating a semiconductor package according to an embodiment of the inventive concept. FIG. 2 is an enlarged sectional view illustrating a portion 'A' of FIG. 1.

Referring to FIGS. 1 and 2, a semiconductor package 10 may include a redistribution substrate 100 and a semiconductor chip 200.

The redistribution substrate 100 may extend in a first direction and a second direction perpendicular to the first direction. The redistribution substrate 100 may include a first insulating layer 111, a second insulating layer 112, a third insulating layer 113, a fourth insulating layer 114, a first redistribution pattern 120, a second redistribution pattern 130, a third redistribution pattern 140, an under-bump pattern 150, a protection pattern 151, and a pad structure 160. In the present specification, the first to third redistribution patterns 120, 130, and 140 may be referred to as 'redistribution patterns'.

The first to fourth insulating layers 111, 112, 113, and 114 may be sequentially stacked. For example, the first insulating layer 111 may be an insulating layer at the lowermost level, and the fourth insulating layer 114 may be an insulating layer at the uppermost level. In the present specification, the first to fourth insulating layers 111, 112, 113, and 114 may be referred to as a redistribution insulating layer. In an embodiment, the first to fourth insulating layers 111, 112, 113, and 114 may be formed of or include the same material, and there may be no observable interface between the first to fourth insulating layers 111, 112, 113, and 114. In certain embodiments, the first to fourth insulating layers 111, 112, 113, and 114 may be provided to have observable interfaces therebetween. The first to fourth insulating layers 111, 112, 113, and 114 may be formed of or include an organic material (e.g., photosensitive polymer). The photosensitive polymer may include or may be formed of at least one of, for example, photosensitive polyimide, polybenzoxazole, phenol-based polymer, and benzocyclobutene-based polymer. Each of the first to fourth insulating layers 111, 112, 113, and 114 may be formed of or include a photo imageable dielectric (PID).

The under-bump pattern 150 may be provided in the first insulating layer 111. The first insulating layer 111 may cover the under-bump pattern 150. The first insulating layer 111 may be provided to expose bottom surfaces 150b of the under-bump patterns 150 (i.e., the first insulating layer 111 may not cover the bottom surfaces 150b of the under-bump patterns 150). The under-bump pattern 150 may have a tapered shape which has a decreasing width with decreasing distance to a top surface 150a of the under-bump pattern 150. For example, a width W1 of the top surface 150a of the under-bump pattern 150 may be smaller than a width W2 of the bottom surface 150b of the under-bump pattern 150. The width of the under-bump pattern 150 may decrease with decreasing distance from the top surface 150a of the under-bump pattern 150. Accordingly, an angle (θ) between the bottom surface 150b of the under-bump pattern 150 and a side surface 150c of the under-bump pattern 150 may be an acute angle. For example, the angle (θ) between the bottom surface 150b of the under-bump pattern 150 and the side surface 150c of the under-bump pattern 150 may be equal to or greater than 70° and may be smaller than 90°. In detail, the angle (θ) between the bottom surface 150b of the under-bump pattern 150 and the side surface 150c of the under-bump pattern 150 may have a value between 70° and 89°. For example, the under-bump pattern 150 may have a trapezoidal shape. For example, the bottom surface 150b of the under-bump pattern 150 may be substantially flat. The redistribution substrate 100 may include a plurality of the under-bump patterns 150, which are spaced apart from each other horizontally (in a direction parallel to a top surface 100a of the redistribution substrate 100 (e.g., in the first direction)). The under-bump patterns 150 may serve as pads of outer terminals 400 to be described below and may be electrically connected to at least one of the redistribution patterns. The under-bump pattern 150 may be formed of or include at least one of conductive metallic materials (e.g., copper (Cu)).

The protection pattern 151 may be interposed between and in contact with the under-bump pattern 150 and the first insulating layer 111. The protection pattern 151 may be interposed between and in contact with the top surface 150a of the under-bump pattern 150 and the first insulating layer 111, and interposed between and in contact with the side surface 150c of the under-bump pattern 150 and the first insulating layer 111. The protection pattern 151 may conformally cover the top surface 150a and the side surface 150c of the under-bump pattern 150. The protection pattern 151 may be in contact with the top surface 150a and the side surface 150c of the under-bump pattern 150. The protection pattern 151 may be in contact with the first insulating layer 111. The protection pattern 151 may not be disposed on the bottom surface 150b of the under-bump pattern 150, and the protection pattern 151 may be disposed to expose the bottom surface 150b of the under-bump pattern 150. For example, a thickness T1 of the protection pattern 151 may have a value between 50 nm and 400 nm. In the present specification, the thickness of an element may be a length of the element measured in a direction perpendicular to the top surface 100a of the redistribution substrate 100. In addition, a distance from an inner side surface of the protection pattern 151 to an outer side surface of the protection pattern 151, which is measured in a direction perpendicular to the side surface 150c of the under-bump pattern 150 (e.g., the first direction), may have a value between 50 nm and 400 nm. The protection pattern 151 may be formed of or include a material different from the under-bump pattern 150. The protection pattern 151 may be formed of or include at least one of conductive metallic materials (e.g., Ti, TiN, TiO$_2$, CrN, TiCN, and TiAlN). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

According to an embodiment of the inventive concept, since the under-bump pattern 150 has the tapered shape or the width W1 of the top surface 150a is smaller than the width W2 of the bottom surface 150b, the protection pattern 151 may improve contact and adhesion with side surfaces 150S of the under-bump pattern 150. In addition, due to the protection pattern 151, an adhesion strength between the protection pattern 151 and the first insulating layer 111 may be improved at the interface between the protection pattern 151 and the first insulating layer 111. Accordingly, it may be possible to reduce or prevent an occurrence of a delamination phenomenon or crack issue at interfaces between the under-bump pattern 150 and the protection pattern 151 and between the protection pattern 151 and the first insulating layer 111. Furthermore, due to the protection pattern 151, it may be possible to prevent an oxide layer from being formed on a surface of the under-bump pattern 150. Accordingly, a semiconductor package with improved reliability may be provided.

The first redistribution pattern 120 may be provided in the redistribution substrate 100. The first redistribution pattern 120 may be disposed on a corresponding one of the under-bump patterns 150. The redistribution substrate 100 may include a plurality of the first redistribution patterns 120, which are horizontally spaced apart from each other. Each of the first redistribution patterns 120 may include a first seed pattern 121 and a first conductive pattern 125. The first conductive pattern 125 may be disposed on the first seed pattern 121.

The first conductive pattern 125 may include a first via portion 120V and a first wire portion 120W. The first wire portion 120W and the first via portion 120V may be connected to each other without an interface therebetween. The first wire portion 120W may be provided on the first via portion 120V. The first wire portion 120W may have a long axis extending in a direction parallel to the top surface 100a of the redistribution substrate 100 (e.g., the first direction). The first wire portion 120W may be disposed on a top surface of the first insulating layer 111. For example, a width of the first wire portion 120W may be larger than a width of the first via portion 120V. The first via portion 120V may have a shape protruding toward a bottom surface 100b of the redistribution substrate 100 (e.g., protruding in a third direction perpendicular to the first direction and the second direction). For example, a width of the uppermost portion of the first via portion 120V may be larger than a width of the lowermost portion of the first via portion 120V. As a result, the first via portion 120V may have a tapered shape opposite to the tapered shape of the under-bump pattern 150. For example, with respect to the under-bump pattern 150, the width of the top surface 150a of the under-bump pattern 150 is smaller than the width of the bottom surface 150a. On the contrary, with respect to the first via portion 120V, the width of the uppermost portion (e.g., the portion closest to the first wire portion 120W in the third direction) of the first via portion 120V is larger than a width of the lowermost portion (e.g., the portion farthest from the first wire portion 120W in the third direction) of the first via portion 120V. In the present specification, the width of an element may be a length of the element measured in a direction parallel to the top surface 100a of the redistribution substrate 100 (e.g., the first direction). The first insulating layer 111 may cover at least a portion of the first via portion 120V. The first insulating layer 111 may not cover the first wire portion 120W. The second insulating layer 112 may cover the first wire portion 120W. The first conductive pattern 125 may be formed of or include at least one of conductive metallic materials (e.g., copper (Cu)).

The first seed pattern 121 may be provided on a bottom surface of the first conductive pattern 125. The first seed pattern 121 may be in contact with the protection pattern 151. The first seed pattern 121 may be interposed between the first conductive pattern 125 and the first insulating layer 111 and between the first conductive pattern 125 and the protection pattern 151. The first seed pattern 121 may be interposed between a bottom surface of the first wire portion 120W and the top surface of the first insulating layer 111, between a side surface of the first via portion 120V and the first insulating layer 111, and between a bottom surface of the first via portion 120V and the protection pattern 151. The first seed pattern 121 may be formed of or include at least one of conductive metallic materials (e.g., copper (Cu), titanium (Ti), and/or alloys thereof).

The second redistribution pattern 130 may be provided in the redistribution substrate 100. The second redistribution pattern 130 may be disposed on the first redistribution pattern 120. The first redistribution pattern 120 may include a plurality of second redistribution patterns 130, which are horizontally spaced apart from each other. Each of the second redistribution patterns 130 may include a second seed pattern 131 and a second conductive pattern 135. The second conductive pattern 135 may be disposed on the second seed pattern 131.

The second conductive pattern 135 may include a second via portion 130V and a second wire portion 130W. The second wire portion 130W and the second via portion 130V may be connected to each other without an interface therebetween. The second wire portion 130W may be provided on the second via portion 130V. The second wire portion 130W may have a long axis extending in a direction parallel to the top surface 100a of the redistribution substrate 100 (e.g., the first direction). The second wire portion 130W may be disposed on a top surface of the second insulating layer 112. For example, a width of the second wire portion 130W may be larger than a width of the second via portion 130V. The second via portion 130V may have a shape protruding toward the bottom surface 100b of the redistribution substrate 100. For example, a width of the uppermost portion of the second via portion 130V may be larger than a width of the lowermost portion of the second via portion 130V. The second insulating layer 112 may cover at least a portion of the second via portion 130V. The second insulating layer 112 may not cover the second wire portion 130W. The third insulating layer 113 may cover the second wire portion 130W. The second conductive pattern 135 may be formed of or include at least one of conductive metallic materials (e.g., copper (Cu)).

The second seed pattern 131 may be provided on a bottom surface of the second conductive pattern 135. The second seed pattern 131 may be in contact with the first redistribution pattern 120. The second seed pattern 131 may be in contact with the first wire portion 120W. The second seed pattern 131 may be interposed between the second conductive pattern 135 and the second insulating layer 112 and between the second conductive pattern 135 and the first redistribution pattern 120. The second seed pattern 131 may be interposed between a bottom surface of the second wire portion 130W and the top surface of the second insulating layer 112, between a side surface of the second via portion 130V and the second insulating layer 112, and between a bottom surface of the second via portion 130V and the first wire portion 120W. The second seed pattern 131 may be formed of or include at least one of conductive metallic materials (e.g., copper (Cu), titanium (Ti), and/or alloys thereof).

The third redistribution pattern 140 may be provided in the redistribution substrate 100. The third redistribution pattern 140 may be disposed on the second redistribution pattern 130. The third redistribution pattern 140 may include a plurality of the third redistribution patterns 140, which are horizontally spaced apart from each other. Each of the third redistribution patterns 140 may include a third seed pattern 141 and a third conductive pattern 145. The third conductive pattern 145 may be disposed on the third seed pattern 141.

The third conductive pattern 145 may include a third via portion 140V and a third wire portion 140W. The third wire portion 140W and the third via portion 140V may be connected to each other without an interface therebetween. The third wire portion 140W may be provided on the third via portion 140V. The third wire portion 140W may have a long axis extending in a direction parallel to the top surface 100a of the redistribution substrate 100 (e.g., the first direction). The third wire portion 140W may be disposed on a top surface of the third insulating layer 113. For example, a width of the third wire portion 140W may be larger than a width of the third via portion 140V. The third via portion 140V may have a shape protruding toward the bottom surface 100b of the redistribution substrate 100. For example, a width of the uppermost portion of the third via portion 140V may be larger than a width of the lowermost portion of the third via portion 140V. The third insulating layer 113 may cover at least a portion of the third via portion 140V. The third insulating layer 113 may not cover the third wire portion 140W. The fourth insulating layer 114 may cover the third wire portion 140W. The third conductive pattern 145 may be formed of or include at least one of conductive metallic materials (e.g., copper (Cu)).

The third seed pattern 141 may be provided on a bottom surface of the third conductive pattern 145. The third seed pattern 141 may be in contact with the second redistribution pattern 130. The third seed pattern 141 may be in contact with the second wire portion 130W. The third seed pattern 141 may be interposed between the third conductive pattern 145 and the third insulating layer 113 and between the third conductive pattern 145 and the second redistribution pattern 130. The third seed pattern 141 may be interposed between a bottom surface of the third wire portion 140W and the top surface of the third insulating layer 113, between a side surface of the third via portion 140V and the third insulating layer 113, and between a bottom surface of the third via portion 140V and the second wire portion 130W. The third seed pattern 141 may be formed of or include at least one of conductive metallic materials (e.g., copper (Cu), titanium (Ti), and/or alloys thereof).

The pad structure 160 may be provided on the third redistribution pattern 140. A plurality of the pad structures 160, which are horizontally spaced apart from each other, may be provided on the third redistribution pattern 140. Each of the pad structures 160 may include a pad seed pattern 161, a pad conductive pattern 165, and a capping pattern 167. The pad conductive pattern 165 may be disposed on the pad seed pattern 161.

The pad conductive pattern 165 may include a pad via portion 160V and a pad wire portion 160W. The pad wire portion 160W and the pad via portion 160V may be connected to each other without an interface therebetween. The pad wire portion 160W may be provided on the pad via portion 160V. The pad wire portion 160W may have a long axis extending in a direction parallel to the top surface 100a of the redistribution substrate 100 (e.g., the first direction). The pad wire portion 160W may be disposed on a top surface of the fourth insulating layer 114. For example, a width of the pad wire portion 160W may be larger than a width of the pad via portion 160V. The pad via portion 160V may have a shape protruding toward the bottom surface 100b of the redistribution substrate 100. For example, a width of the uppermost portion of the pad via portion 160V may be larger than a width of the lowermost portion of the pad via portion 160V. The fourth insulating layer 114 may cover at least a portion of the pad via portion 160V. The fourth insulating layer 114 may not cover the pad wire portion 160W. The pad wire portion 160W may be exposed to the outside of the fourth insulating layer 114 near the top surface of the fourth insulating layer 114. The pad conductive pattern 165 may be formed of or include at least one of conductive metallic materials (e.g., copper (Cu)).

The pad seed pattern 161 may be provided on a bottom surface of the pad conductive pattern 165. The pad seed pattern 161 may be in contact with the third redistribution pattern 140. The pad seed pattern 161 may be in contact with the third wire portion 140W. The pad seed pattern 161 may be interposed between the pad conductive pattern 165 and the fourth insulating layer 114 and between the pad conductive pattern 165 and the third redistribution pattern 140. The pad seed pattern 161 may be interposed between a bottom surface of the pad wire portion 160W and the top surface of the fourth insulating layer 114, between a side surface of the pad via portion 160V and the fourth insulating layer 114, and between a bottom surface of the pad via portion 160V and the third wire portion 140W. The pad seed pattern 161 may be formed of or include at least one of conductive metallic materials (e.g., copper (Cu), titanium (Ti), and/or alloys thereof).

The capping pattern 167 may be provided on the pad conductive pattern 165. The capping pattern 167 may cover a top surface of the pad conductive pattern 165. The capping pattern 167 may cover a top surface of the pad wire portion 160W. The capping pattern 167 may be formed of or include a material different from the pad conductive pattern 165. The capping pattern 167 may be formed of or include at least one of conductive metallic materials (e.g., nickel (Ni), gold (Au), and/or alloys thereof).

An outer terminal 400 may be provided on the bottom surface 100b of the redistribution substrate 100. The outer terminal 400 may be disposed on the bottom surface 150b of the under-bump pattern 150. The outer terminal 400 may be in contact with the bottom surface 150b of the under-bump pattern 150. The outer terminal 400 may be provided in the form of at least one of solder balls, solder pillars, and solder bumps. The outer terminal 400 may be formed of or include at least one of conductive metallic materials (e.g., tin (Sn), lead (Pb), nickel (Ni), gold (Au), silver (Ag), copper (Cu), aluminum (Al), and bismuth (Bi)). The outer terminal 400 may be coupled to an external device (not shown). A plurality of the outer terminals 400, which are horizontally spaced apart from each other, may be provided on the bottom surface 100b of the redistribution substrate 100. In the present specification, the expression "two elements are electrically connected/coupled to each other" may mean that the elements are directly connected/coupled to each other or are indirectly connected/coupled to each other through another conductive element.

The semiconductor chip 200 may be mounted on the top surface 100a of the redistribution substrate 100. In an embodiment, the semiconductor chip 200 may be a memory chip, a logic chip, or a sensing chip, but the inventive concept is not limited to this example. The memory chip may be or include at least one of dynamic random-access memory (DRAM), static random-access memory (SRAM), magnetic random-access memory (MRAM), or FLASH memory chips. The semiconductor chip 200 may include chip pads 210 which are placed near a bottom surface thereof. The chip pads 210 may be electrically connected to integrated circuits of the semiconductor chip 200 through interconnection lines in the semiconductor chip 200.

A connection terminal 250 may be provided on the pad structure 160. The pad structure 160 may include a plurality of the connection terminals 250, which are horizontally spaced apart from each other. The connection terminal 250 may be interposed between the semiconductor chip 200 and the redistribution substrate 100. The connection terminal 250 may be interposed between and electrically connected to the pad structure 160 and the chip pad 210. The semiconductor chip 200 may be electrically connected to the redistribution substrate 100 through the connection terminals 250. Each of the connection terminals 250 may be in contact with a top surface of the pad structure 160. The connection terminals 250 may be provided in the form of at least one of solder balls, solder pillars, and solder bumps. The connection terminals 250 may be formed of or include at least one of conductive metallic materials (e.g., tin (Sn), lead (Pb), nickel (Ni), gold (Au), silver (Ag), copper (Cu), aluminum (Al), and bismuth (Bi)).

A mold layer 300 may be provided on the redistribution substrate 100. The mold layer 300 may cover the top surface 100a of the redistribution substrate 100 and the semiconductor chip 200. The mold layer 300 may cover top and side surfaces of the semiconductor chip 200. The mold layer 300 may be interposed between the connection terminals 250 to cover the connection terminals 250. The mold layer 300 may be formed of or include an insulating polymer (e.g., epoxy molding compound). In an embodiment, although not illustrated in FIG. 1, the mold layer 300 may not cover the top surface of the semiconductor chip 200 (i.e., the mold layer 300 may expose the top surface of the semiconductor chip 200).

FIGS. 3 to 14 are sectional views illustrating a method of fabricating a semiconductor package according to an embodiment of the inventive concept. For concise description, a previously described element may be identified by the same reference number without repeating an overlapping description thereof.

Referring to FIG. 3, a first carrier substrate 900 may be provided. A release layer 910 may be formed on the first carrier substrate 900. A lower seed layer 156 may be formed on the release layer 910. The lower seed layer 156 may be attached to the first carrier substrate 900 by the release layer 910. The lower seed layer 156 may be formed of or include at least one of conductive metallic materials (e.g., titanium (Ti)).

A photoresist layer PR may be formed on the lower seed layer 156. For example, the photoresist layer PR may be a negative photoresist layer. The negative photoresist layer may be a photosensitive film, in which an exposed portion is chemically coupled and is not dissolved by developing solution, and in which an unexposed portion is removed by the developing solution. A mask 930 may be provided on the photoresist layer PR. A region, on which the mask 930 is not disposed, may correspond to a region, on which a photoresist pattern PP to be described below will be formed. A region, on which the mask 930 is disposed, may correspond to a region, on which an opening OP to be described below will be formed. An exposure process may be performed to irradiate the photoresist layer PR with light. An exposure region 150R of the photoresist layer PR, which is exposed by the mask 930, may be chemically coupled by the exposure process. The chemically-coupled exposure region 150R of the photoresist layer PR may not be removed by a developing process, which will be described below, and may be left.

Referring to FIG. 4, a developing process may be performed on the photoresist layer PR. The photoresist layer PR, which is disposed on a bottom surface of the mask 930, may be removed by the developing process, and as a result, photoresist patterns PP with the opening OP may be formed. The opening OP may be formed to expose a portion of the lower seed layer 156 and a side surface of the photoresist pattern PP. The side surface of the opening OP may correspond to the side surface of the photoresist pattern PP. The opening OP may have a tapered shape having a decreasing width in an upward direction. For example, the opening OP may have a width increasing with decreasing distance to a bottom surface thereof. An upper width of the opening OP may be smaller than a lower width of the opening OP. Accordingly, an angle between the bottom surface of the opening OP and the inner side surface of the opening OP may be an acute angle. For example, the angle between the bottom surface of the opening OP and the inner side surface of the opening OP may be greater than or equal to 70° and may be smaller than 90°. In detail, the angle between the bottom surface of the opening OP and the inner side surface of the opening OP may have a value between 70° and 89°. For example, the opening OP may have a trapezoidal shape.

Since a negative photoresist layer is used as the photoresist layer PR, the photoresist pattern PP may have a tapered shape that has a decreasing width with decreasing distance to a bottom surface of the photoresist pattern PP. For example, a width of a top surface of the photoresist pattern PP may be larger than a width of the bottom surface of the photoresist pattern PP. The width of the photoresist pattern PP may increase with decreasing distance to the top surface of the photoresist pattern PP. For example, an angle between the bottom surface of the photoresist pattern PP and the side surface of the photoresist pattern PP may be an obtuse angle. For example, the angle between the bottom surface of the photoresist pattern PP and the side surface of the photoresist pattern PP may be greater than 90° and may be smaller than 110°. In detail, the angle between the bottom surface of the photoresist pattern PP and the side surface of the photoresist pattern PP may be greater than 91° and may be smaller than 110°. For example, the photoresist pattern PP may have an inverted trapezoidal shape. In an embodiment, an angle between the bottom surface of the photoresist pattern PP, which is adjacent to a side surface of the first carrier substrate 900, and the side surface of the photoresist pattern PP may be the right angle.

Figure 5:
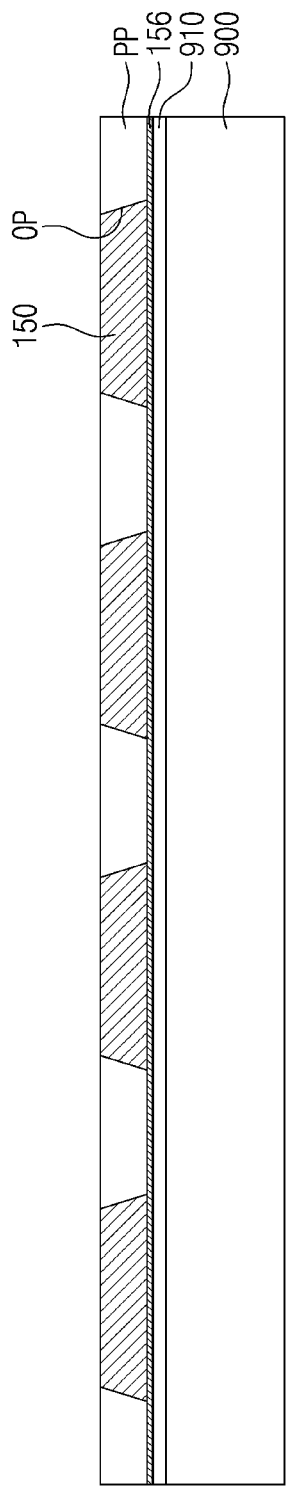

Referring to FIG. 5, the under-bump patterns 150 may be formed in the openings OP, respectively. For example, the under-bump patterns 150 may be formed by an electroplating process, in which the lower seed layer 156 is used as an electrode. The under-bump pattern 150 may have a tapered shape that has a decreasing width with decreasing distance to the top surface 150a of the under-bump pattern 150.

Figure 6:
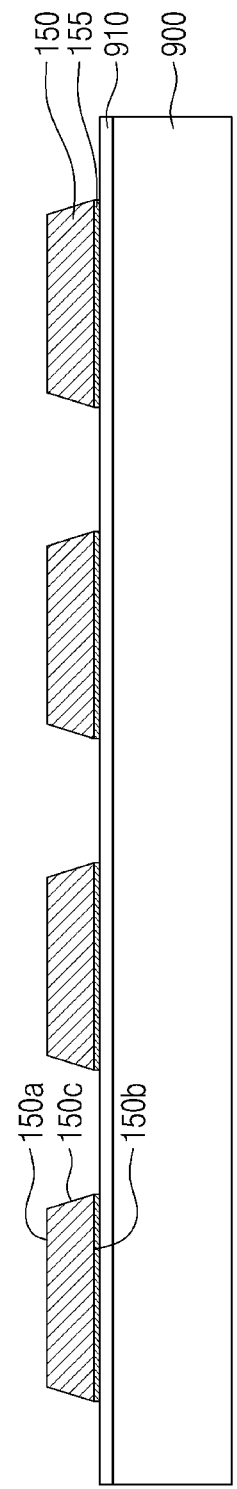

Referring to FIG. 6, the photoresist pattern PP may be removed to expose other portion of the lower seed layer 156 and the side surfaces 150c of the under-bump patterns 150. For example, the photoresist pattern PP may be removed by a strip process.

Lower seed patterns 155 may be formed by removing the other portion of the lower seed layer 156 exposed by the photoresist pattern PP. Each of the lower seed patterns 155 may be formed on the bottom surface 150b of the under-bump patterns 150. A portion of the release layer 910 may be exposed by the lower seed patterns 155. For example, the formation of the lower seed patterns 155 may include an etching process. The under-bump patterns 150 may have an etch selectivity with respect to the lower seed layer 156. The portion of the lower seed layer 156, which is disposed on the bottom surface 150b of the under-bump patterns 150, may not be removed by the etching process, and thus, the lower seed patterns 155 may be formed.

Figure 7:
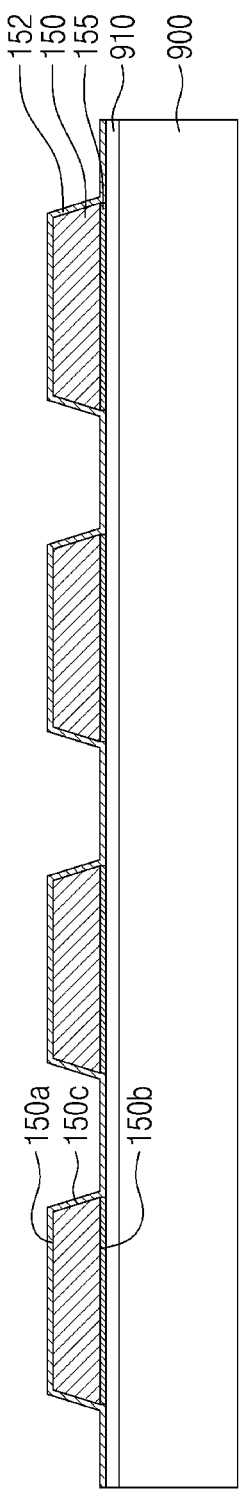

Referring to FIG. 7, a protection layer 152 may be formed on the release layer 910 and the under-bump patterns 150. The protection layer 152 may be formed to conformally cover the portion of the release layer 910, side surfaces of the lower seed pattern 155, the top surface 150a of the under-bump patterns 150, and the side surfaces 150c of the under-bump patterns 150. The protection layer 152 may be formed by a physical vapor deposition (PVD) process or a chemical vapor deposition (CVD) process. The protection layer 152 may be formed of or include at least one of conductive metallic materials (e.g., Ti, TiN, $TiO_2$, CrN, TiCN, and TiAlN). In an embodiment, the protection layer 152 may be formed of or include the same material as the lower seed layer 156.

Referring to FIG. 8, the first insulating layer 111 may be formed on the protection layer 152. The first insulating layer 111 may cover the protection layer 152. The first insulating layer 111 may be formed by a coating process (e.g., a spin coating process or a slit coating process). The first insulating layer 111 may be patterned to form a plurality of holes 111T in the first insulating layer 111. Each of the holes 111T may be formed to partially expose a top surface of the protection layer 152. The patterning of the first insulating layer 111 may include performing an exposure process and a developing process. As an example, each of the holes 111T may have a tapered shape whose distance decreases in a downward direction.

Referring to FIG. 9, a plurality of first redistribution patterns 120 may be formed on the first insulating layer 111. The formation of the first redistribution patterns 120 may include forming the first seed patterns 121 and forming the first conductive patterns 125. Each of the first seed patterns 121 may be provided to conformally cover a portion of the top surface of the first insulating layer 111, an inner side surface of the hole 111T, and a bottom surface of the hole 111T. The first seed patterns 121 may be formed by performing a deposition process and an etching process. The first conductive patterns 125 may be formed on the first seed patterns 121, respectively. The first conductive patterns 125 may be formed to fill remaining portions of the holes 111T, respectively, and to cover top surfaces of the first seed patterns 121. The first conductive patterns 125 may be formed by an electroplating process, in which the first seed pattern 121 is used as an electrode, and an etching process.

Figure 10:
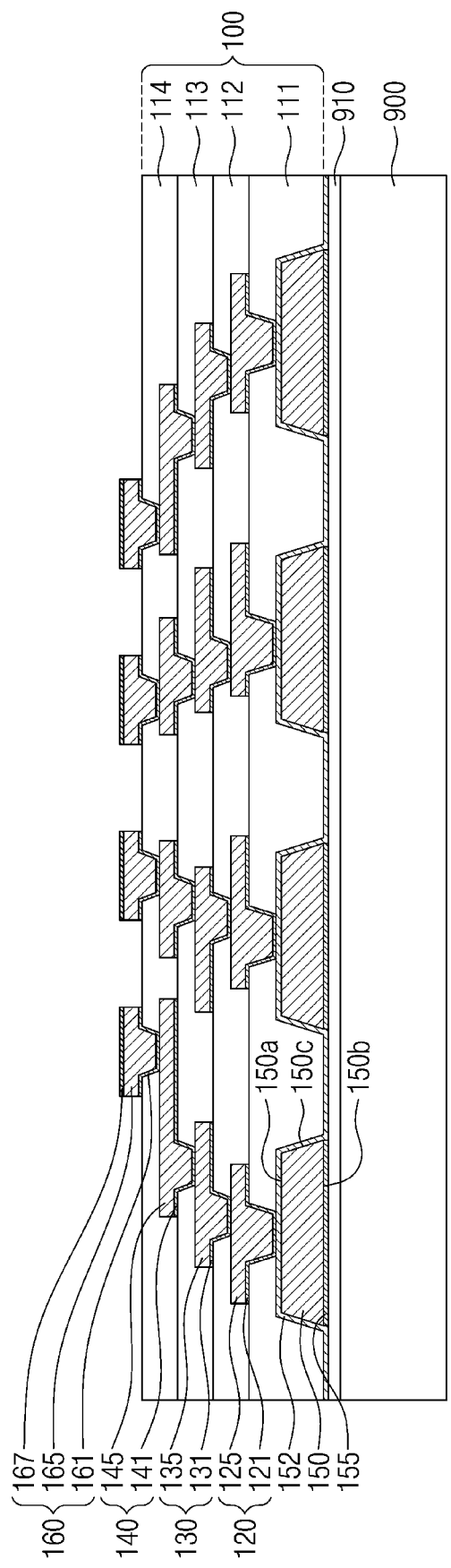

Referring to FIG. 10, the second insulating layer 112 may be formed on the first insulating layer 111. The second insulating layer 112 may cover the first insulating layer 111 and the first redistribution patterns 120. The second insulating layer 112 may be formed by a coating process (e.g., a spin coating process or a slit coating process). A hole (not shown) may be formed in the second insulating layer 112. A plurality of second redistribution patterns 130 may be formed on the second insulating layer 112. The formation of the second redistribution patterns 130 may include forming the second seed patterns 131 and forming the second conductive patterns 135. The second seed patterns 131 may be formed by the same method as that for the first seed patterns 121, and the second conductive patterns 135 may be formed by the same method as that for the first conductive patterns 125.

The third insulating layer 113 may be formed on the second insulating layer 112. The third insulating layer 113 may cover the second insulating layer 112 and the second redistribution patterns 130. The third insulating layer 113 may be formed by a coating process (e.g., a spin coating process or a slit coating process). A hole (not shown) may be formed in the third insulating layer 113. A plurality of third redistribution patterns 140 may be formed on the third insulating layer 113. The formation of the third redistribution patterns 140 may include forming the third seed patterns 141 and forming the third conductive patterns 145. The third seed patterns 141 may be formed by the same method as that for the first seed patterns 121, and the third conductive patterns 145 may be formed by the same method as that for the first conductive patterns 125.

The fourth insulating layer 114 may be formed on the third insulating layer 113. The fourth insulating layer 114 may cover the third insulating layer 113 and the third redistribution patterns 140. The fourth insulating layer 114 may be formed by a coating process (e.g., a spin coating process or a slit coating process). A hole (not shown) may be formed in the fourth insulating layer 114. A plurality of the pad structures 160 may be formed on the fourth insulating layer 114. The formation of the pad structures 160 may include forming the pad seed patterns 161, forming the pad conductive patterns 165, and forming the capping patterns 167. The pad seed patterns 161 may be formed by the same method as the first seed patterns 121, and the pad conductive patterns 165 may be formed by the same method as the first conductive patterns 125. The capping patterns 167 may be formed to cover the pad conductive patterns 165, respectively. The capping patterns 167 may be formed by performing a deposition process and an etching process. Accordingly, the redistribution substrate 100 may be formed.

Figure 11:
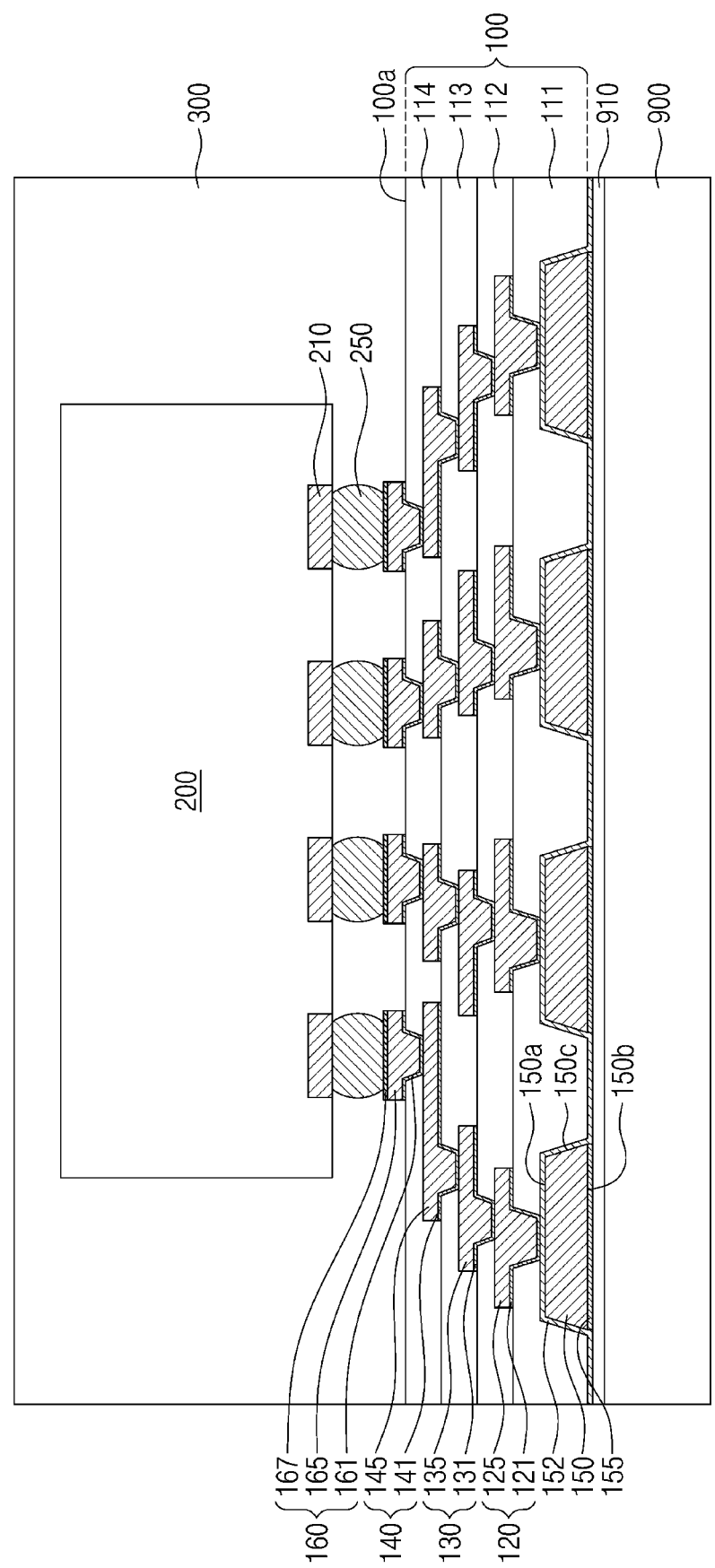

Referring to FIG. 11, the semiconductor chip 200 including the chip pads 210 may be mounted on the top surface 100a of the redistribution substrate 100. The chip pads 210 may be electrically connected to at least one of the first to third redistribution patterns 120, 130, and 140. The semiconductor chip 200 may be disposed such that the chip pads 210 are aligned to the pad structures 160, respectively. The connection terminals 250 may be formed between the semiconductor chip 200 and the redistribution substrate 100. The connection terminals 250 may be electrically connected to the chip pads 210 and the pad structures 160.

The mold layer 300 may be formed on the top surface 100a of the redistribution substrate 100 to cover the top surface of the fourth insulating layer 114. The mold layer 300 may hermetically seal the semiconductor chip 200 and the connection terminals 250. Although not illustrated, the mold layer 300 may not cover a top surface of the semiconductor chip 200.

Figure 12:
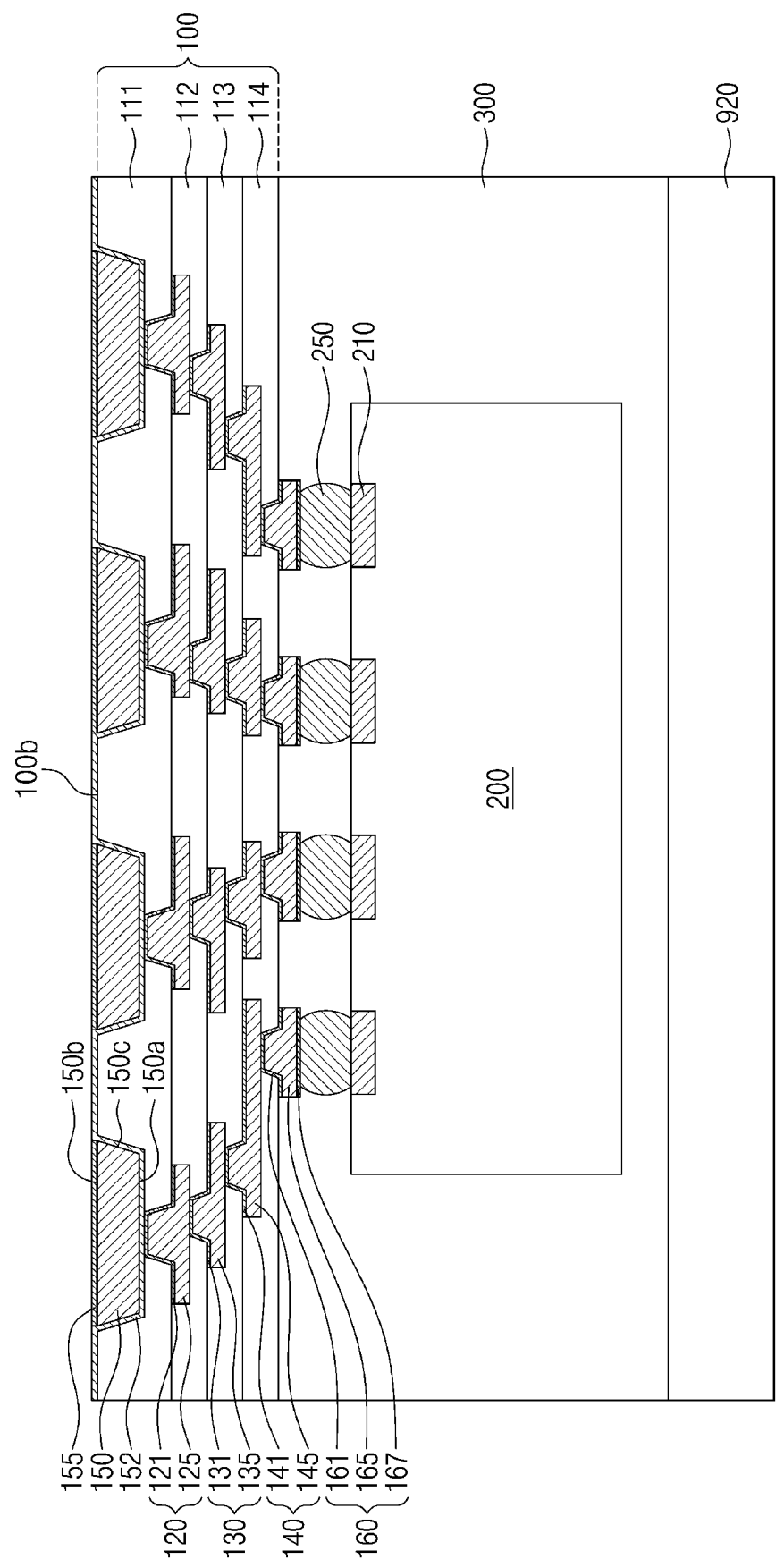

Referring to FIG. 12, a second carrier substrate 920 may be formed on a top surface of the mold layer 300. As illustrated in FIG. 12, the structure of FIG. 11 has been inverted such that a bottom surface of the semiconductor chip 200 is oriented in an upward direction. Additionally, the first carrier substrate 900 and the release layer 910 may be removed, and thus, the protection layer 152 and the lower seed pattern 155 may be exposed. For consistency in description, a top surface, a bottom surface, an upper portion, and a lower portion of each element will be defined, based on the structure shown in FIG. 11.

Figure 13:
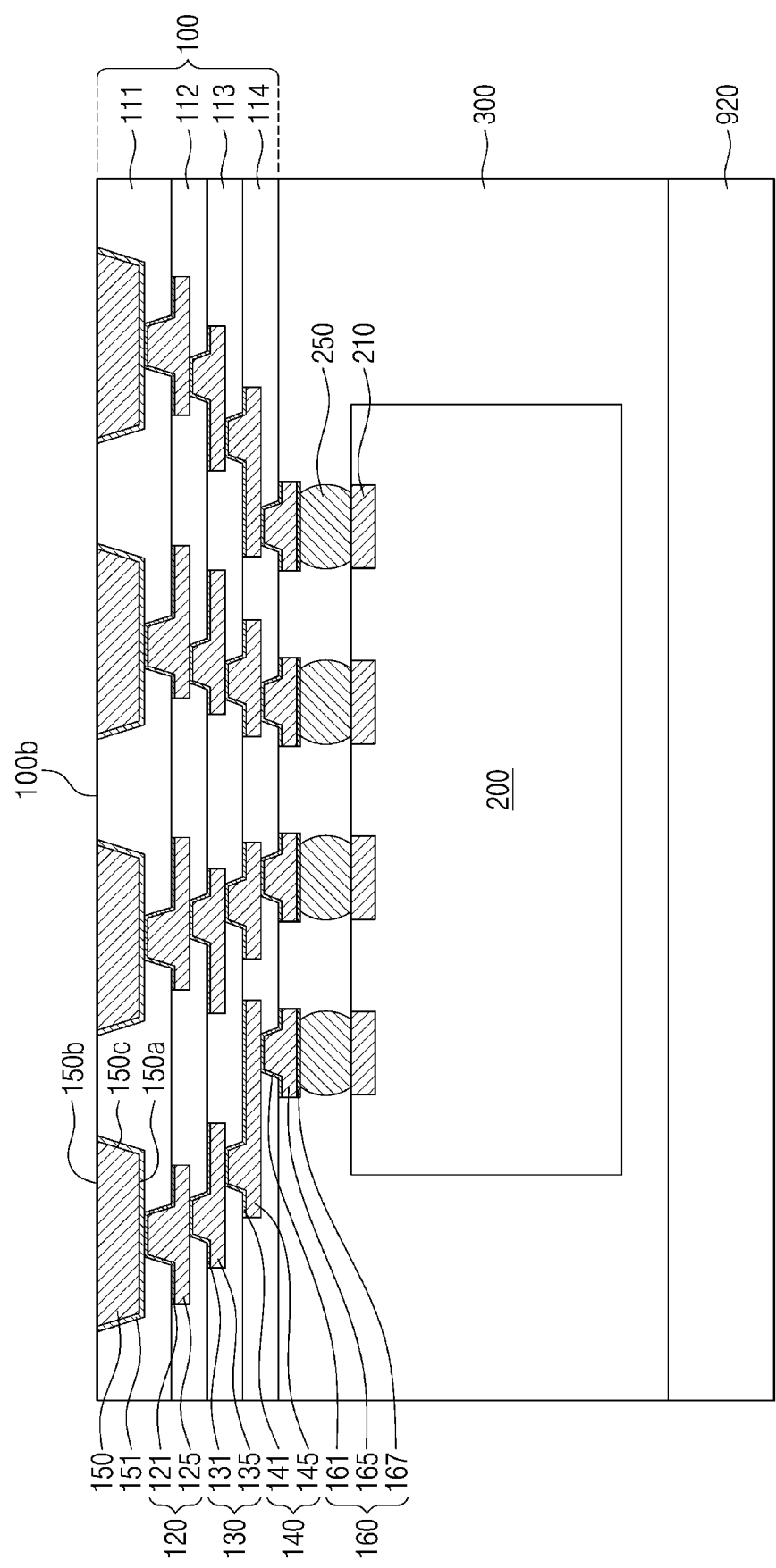

Referring to FIG. 13, the lower seed pattern 155 may be removed, and the protection pattern 151 may be formed by removing a portion of the protection layer 152, which is disposed on the bottom surface 100b of the redistribution substrate 100. The removing of the lower seed pattern 155 and the forming of the protection pattern 151 may be performed by an etching process. As a result of the etching process, the bottom surface 100b of the redistribution substrate 100 and the bottom surface 150b of the under-bump pattern 150 may be exposed. The under-bump patterns 150 may be provided to have an etch selectivity with respect to the lower seed pattern 155 and the protection layer 152. The under-bump patterns 150 may not be removed by the etching process. Since a portion of the protection layer 152 and the lower seed pattern 155 are removed, the bottom surfaces 150b of the under-bump patterns 150 may be located at substantially the same level as the bottom surface 100b of the redistribution substrate 100. In an embodiment, since thicknesses of the lower seed pattern 155 and the protection layer 152 are adjusted, the bottom surfaces 150b of the under-bump patterns 150 may be located at a level higher than the bottom surface 100b of the redistribution substrate 100, the bottom surfaces 150b of the under-bump patterns 150 may be located at substantially the same level as the bottom surface 100b of the redistribution substrate 100, or the bottom surfaces 150b of the under-bump patterns 150 may be located at a level lower than the bottom surface 100b of the redistribution substrate 100. In the present specification, the level may mean a vertical height (e.g., in the third direction).

Figure 14:
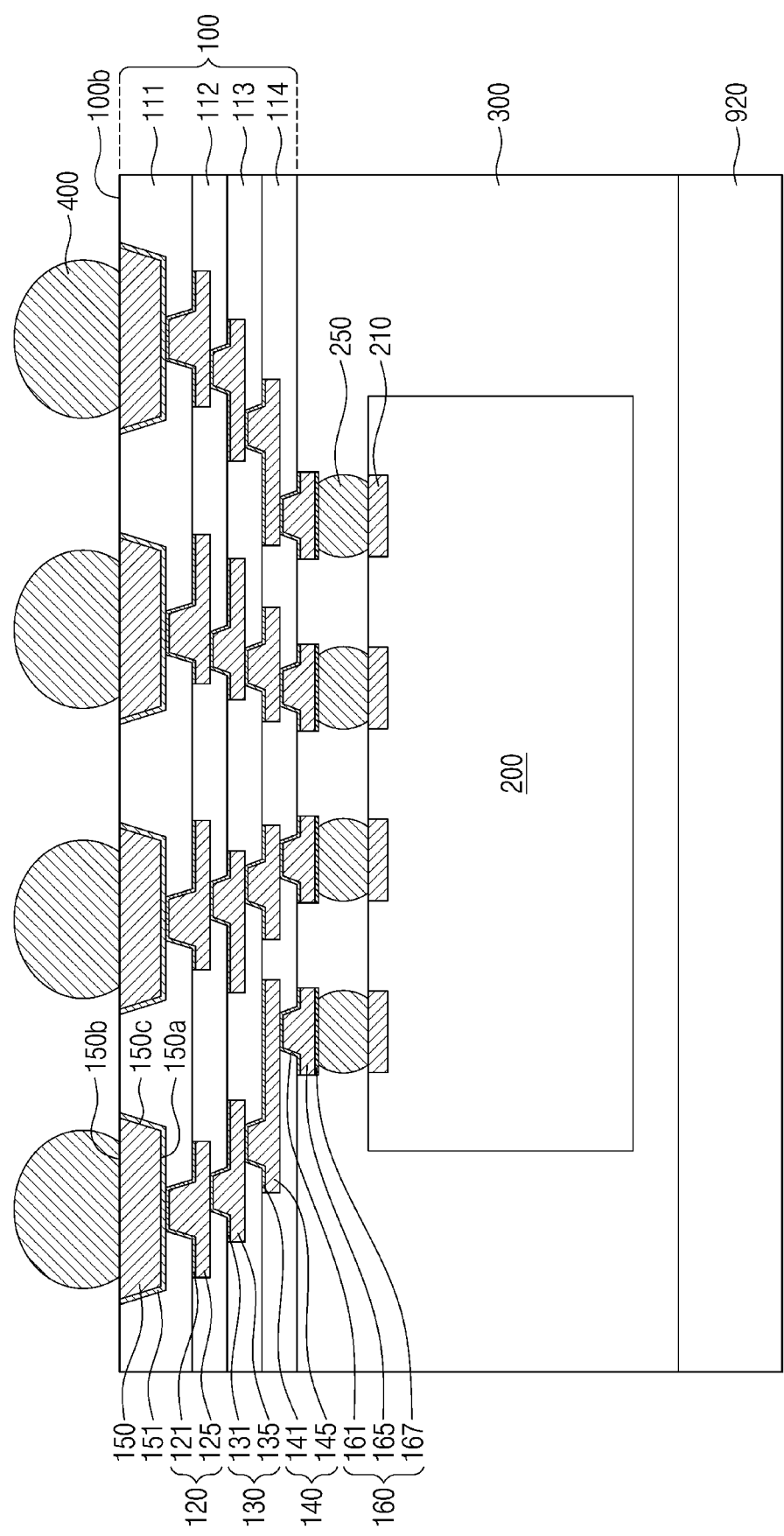

Referring to FIG. 14, the outer terminals 400 may be formed on the bottom surface 150b of the under-bump pattern 150. The formation of the outer terminals 400 may include performing a process of attaching a solder ball.

Referring back to FIG. 1, the second carrier substrate 920 may be inverted such that the top surface 100a of the redistribution substrate 100 is oriented in an upward direction. The second carrier substrate 920 may be removed. Accordingly, the semiconductor package 10 may be formed. Although, for brevity's sake, a method of fabricating just one semiconductor package 10 has been illustrated and described, the fabrication method is not limited to such a chip-level manufacturing. For example, the semiconductor package 10 may be fabricated in a chip level, a panel level, or a wafer level.

According to an embodiment of the inventive concept, after the formation of the under-bump pattern 150, the protection layer 152 may be formed on the under-bump pattern 150, and the first insulating layer 111 may be formed on the protection layer 152. Since the under-bump pattern 150 has the tapered shape or has a decreasing width with decreasing distance to a top surface, the formation of the protection layer 152 may improve contact and adhesion with the side surfaces 150S of the under-bump pattern 150. In addition, due to the protection layer 152, an adhesion strength between the protection layer 152 and the first insulating layer 111 may be improved at an interface between the protection layer 152 and the first insulating layer 111. Accordingly, it may be possible to reduce or prevent an occurrence of a delamination or crack issue at the interface between the under-bump pattern 150 and the protection layer 152 and between the protection layer 152 and the first insulating layer 111. In addition, due to the protection layer 152, it may be possible to prevent an oxide layer from being formed on the surface of the under-bump pattern 150. Furthermore, the under-bump pattern 150 and the first insulating layer 111 may be prevented from being etched by the protection layer 152 when the lower seed pattern 155 on the bottom surface 150b of the under-bump pattern 150 is removed. Thus, a method of fabricating a semiconductor package with improved reliability may be provided.

Figure 15:
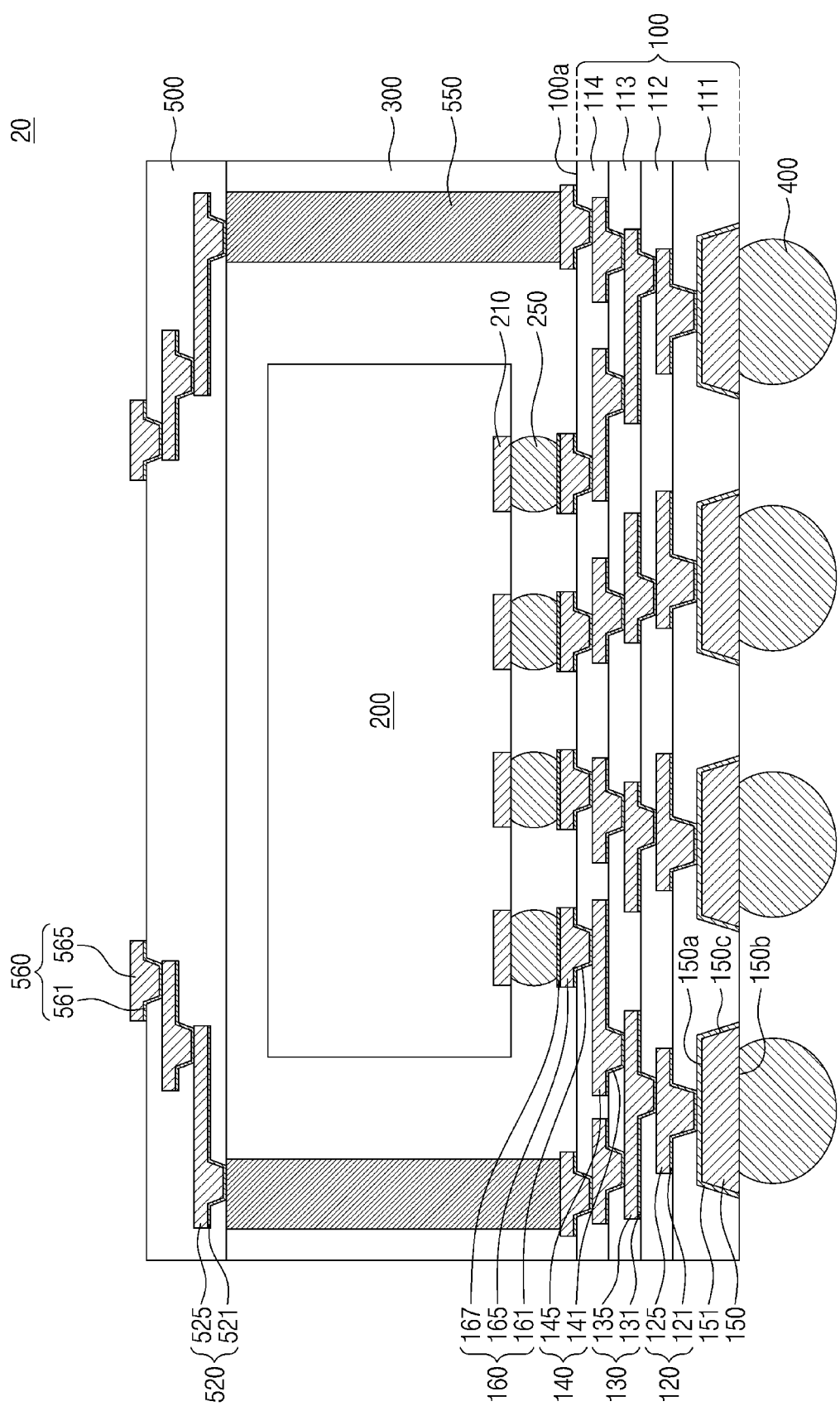
FIG. 15 is a sectional view illustrating a semiconductor package according to an embodiment of the inventive concept.

FIG. 15 is a sectional view illustrating a semiconductor package according to an embodiment of the inventive concept. For concise description, a previously described element may be identified by the same reference number without repeating an overlapping description thereof.

Referring to FIG. 15, a semiconductor package 20 may include a conductive structure 550 and an upper redistribution layer 500, in addition to the redistribution substrate 100, the semiconductor chip 200, the connection terminal 250, and the outer terminal 400. The redistribution substrate 100 may include the first to fourth insulating layers 111, 112, 113, and 114, the first to third redistribution patterns 120, 130, and 140, the under-bump pattern 150, the protection pattern 151, and the pad structure 160. The redistribution substrate 100, the semiconductor chip 200, the connection terminal 250, and the outer terminal 400 may be configured to be substantially the same as those described with reference to FIGS. 1 and 2.

The conductive structure 550 may be disposed on the top surface 100a of the redistribution substrate 100 and may be electrically connected to a corresponding one of the pad structures 160. In an embodiment, the capping pattern 167 may not be interposed between the pad structure 160 and the conductive structure 550. The conductive structure 550 may be horizontally (e.g., in a direction parallel to a top surface 100a of the redistribution substrate 100) spaced apart from the semiconductor chip 200. The conductive structure 550 may be disposed on an edge region of the redistribution substrate 100, when viewed in a plan view. The conductive structure 550 may be electrically connected to at least one of the third redistribution patterns 140. For example, the conductive structure 550 may be a metal pillar. For example, the conductive structure 550 may be formed of or include copper (Cu).

The mold layer 300 may be formed on the top surface 100a of the redistribution substrate 100 to cover the top surface 100a of the redistribution substrate 100, side surface of the conductive structure 550, and the semiconductor chip 200. The mold layer 300 may be formed to expose a top surface of the conductive structure 550 (i.e., the mold layer 300 may not cover a top surface of the conductive structure 550).

The upper redistribution layer 500 may be provided on the conductive structure 550 and the mold layer 300. The upper redistribution layer 500 may be formed of or include at least one of insulating materials (e.g., photosensitive polymer). Upper redistribution patterns 520 and upper pad structures 560 may be provided in the upper redistribution layer 500. The upper redistribution patterns 520 may be vertically stacked. At least one of the upper redistribution patterns 520 may be electrically connected to the conductive structure 550. Each of the upper redistribution patterns 520 may include an upper seed pattern 521 and an upper conductive pattern 525. The upper conductive pattern 525 may be disposed on the upper seed pattern 521. The upper conductive pattern 525 may include a via portion and a wire portion on the via portion. The upper conductive pattern 525 may be formed of or include at least one of conductive metallic materials (e.g., copper (Cu)). The upper seed pattern 521 may be interposed between the upper conductive pattern 525 and the upper redistribution layer 500. The upper seed pattern 521 may be formed of or include at least one of conductive metallic materials (e.g., copper (Cu), titanium (Ti), and/or alloys thereof).

The upper pad structures 560 may be disposed on the uppermost ones of the upper redistribution patterns 520. The upper pad structures 560 may be electrically connected to at least one of the upper redistribution patterns 520.

Each of the upper pad structures 560 may include a first pad pattern 561 and a second pad pattern 565. The second pad pattern 565 may be disposed on the first pad pattern 561. The second pad pattern 565 may include a via portion and a wire portion on the via portion. The second pad pattern 565 may be formed of or include at least one of conductive metallic materials (e.g., copper (Cu)). The first pad pattern 561 may be interposed between the second pad pattern 565 and the upper redistribution layer 500. The first pad pattern 561 may be formed of or include at least one of conductive metallic materials (e.g., copper (Cu), titanium (Ti), and/or alloys thereof).

Figure 16:
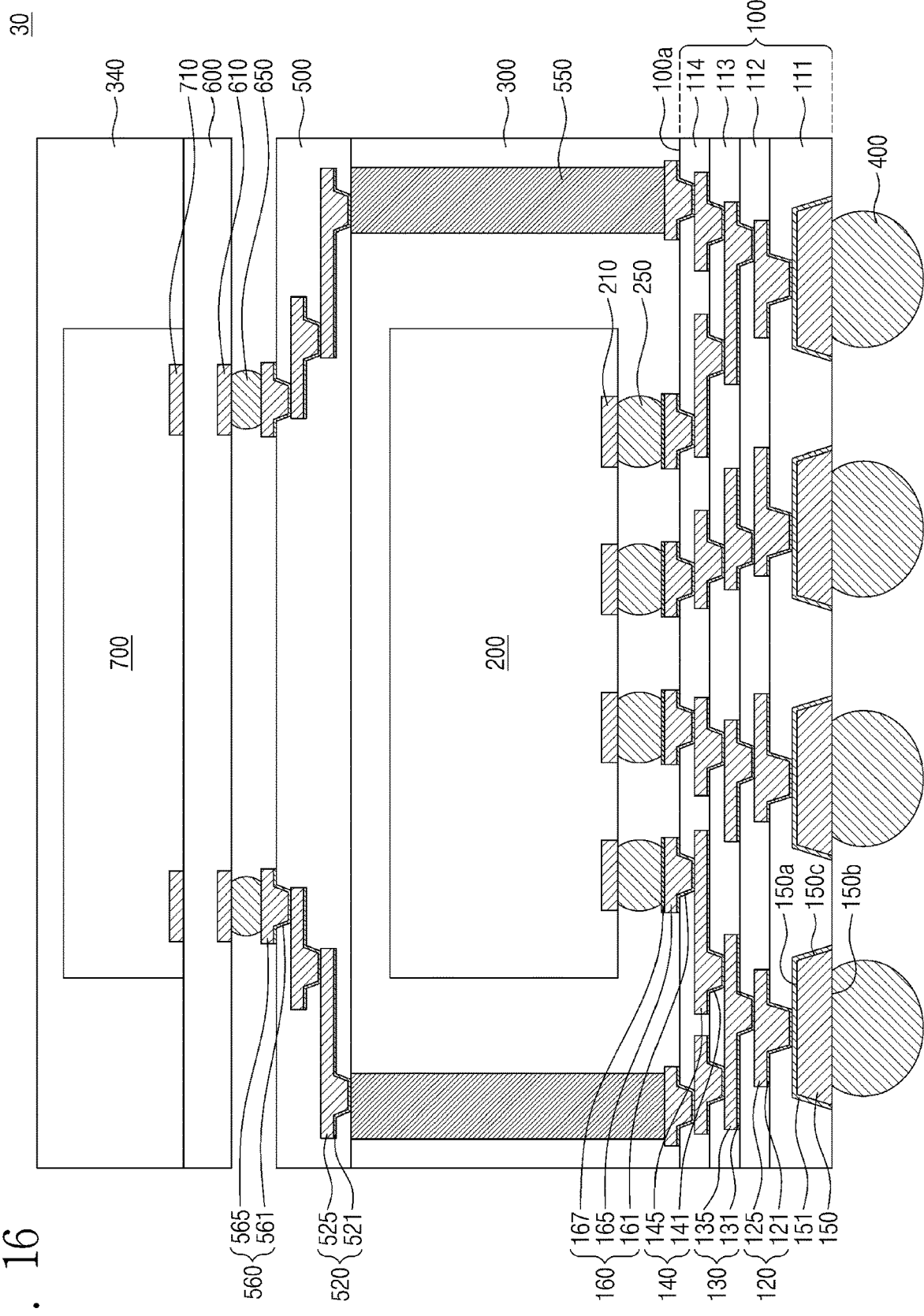
FIG. 16 is a sectional view illustrating a semiconductor package according to an embodiment of the inventive concept.

FIG. 16 is a sectional view illustrating a semiconductor package according to an embodiment of the inventive concept. For concise description, a previously described element may be identified by the same reference number without repeating an overlapping description thereof.

Referring to FIG. 16, a semiconductor package 30 may include an upper package, in addition to the redistribution substrate 100, the semiconductor chip 200, the connection terminal 250, the outer terminal 400, the conductive structure 550, the upper redistribution layer 500, the upper redistribution patterns 520, and the upper pad structures 560. The redistribution substrate 100 may include the first to fourth insulating layers 111, 112, 113, and 114, the first to third redistribution patterns 120, 130, and 140, the under-bump pattern 150, the protection pattern 151, and the pad structure 160. The redistribution substrate 100, the semiconductor chip 200, the connection terminal 250, and the outer terminal 400 may be configured to be substantially the same as those described with reference to FIGS. 1 and 2. The conductive structure 550, the upper redistribution layer 500, the upper redistribution pattern 520, and the upper pad structure 560 may be configured to be substantially the same as those described with reference to FIG. 15.

The upper package may be disposed on the upper redistribution layer 500. The upper package may include an upper substrate 600, an upper semiconductor chip 700, and an upper mold layer 340. For example, the upper substrate 600 may be a printed circuit board (PCB) or a redistribution substrate. The upper substrate 600 may include upper substrate pads 610 which are provided near a bottom surface thereof. An upper terminal 650 may be interposed between the upper substrate pad 610 and the upper pad structure 560. The upper substrate 600 may be electrically connected to the upper redistribution layer 500 by the upper terminal 650. The upper terminal 650 may be formed of or include at least one of conductive metallic materials (e.g., tin (Sn), lead (Pb), nickel (Ni), gold (Au), silver (Ag), copper (Cu), aluminum (Al), and bismuth (Bi)).

The upper semiconductor chip 700 may be mounted on the upper substrate 600. For example, the upper semiconductor chip 700 may be a memory chip, a logic chip, or a sensing chip, but the inventive concept is not limited to this example. The semiconductor chip 700 may include upper chip pads 710 which are provided near a bottom surface thereof. The upper chip pads 710 may be electrically connected to interconnection lines in the upper substrate 600.

The upper mold layer 340 may be provided on the upper substrate 600. The upper mold layer 340 may cover a top surface of the upper substrate 600 and the upper semiconductor chip 700. The upper mold layer 340 may be formed of or include an insulating polymer (e.g., epoxy molding compound).

Figure 17:
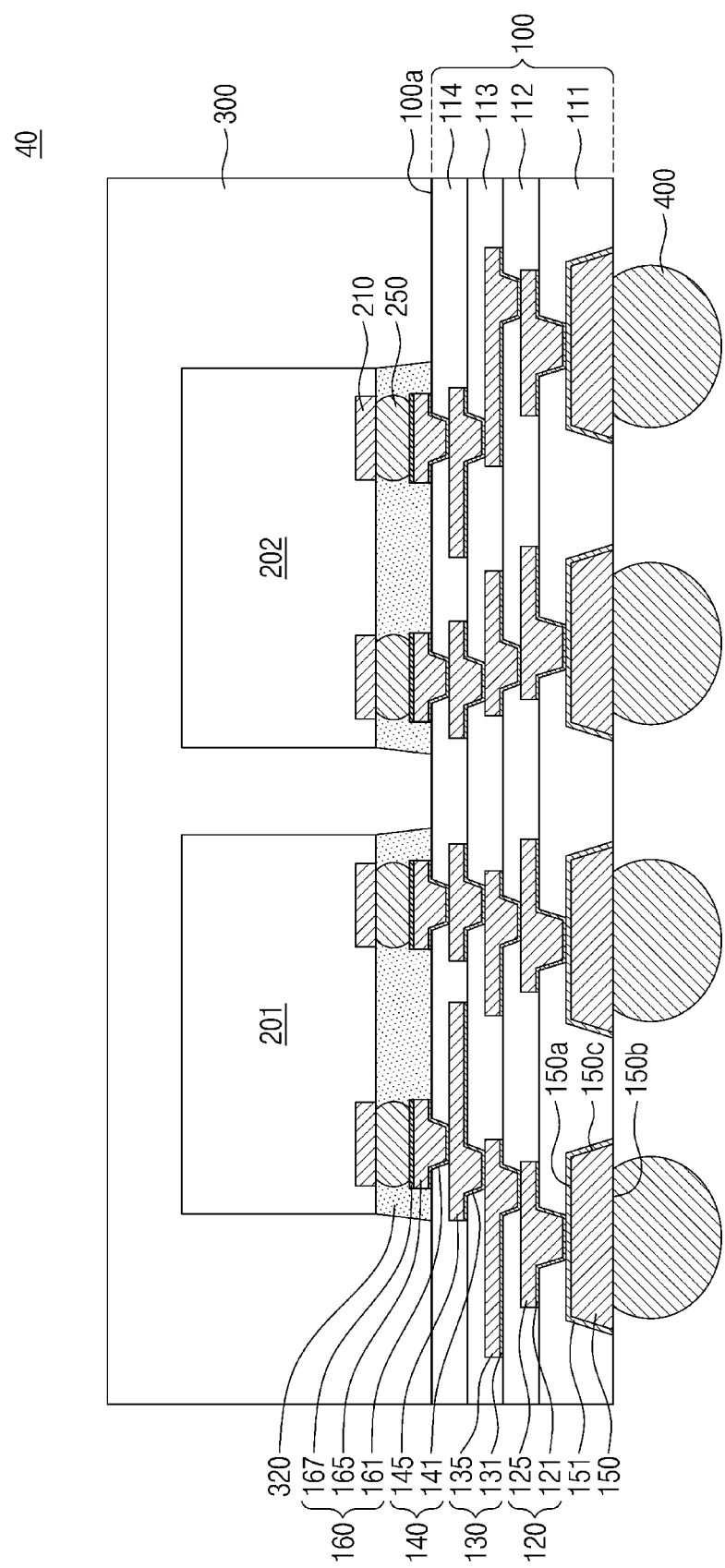
FIG. 17 is a sectional view illustrating a semiconductor package according to an embodiment of the inventive concept.

FIG. 17 is a sectional view illustrating a semiconductor package according to an embodiment of the inventive concept. For concise description, a previously described element may be identified by the same reference number without repeating an overlapping description thereof.

Referring to FIG. 17, a semiconductor package 40 may include a first semiconductor chip 201 and a second semiconductor chip 202, in addition to the redistribution substrate 100 and the outer terminal 400. The redistribution substrate 100 may include the first to fourth insulating layers 111, 112, 113, and 114, the first to third redistribution patterns 120, 130, and 140, the under-bump pattern 150, the protection pattern 151, and the pad structure 160. The redistribution substrate 100 and the outer terminal 400 may be configured to be substantially the same as those described with reference to FIGS. 1 and 2.

The first semiconductor chip 201 and the second semiconductor chip 202 may be mounted on the top surface 100a of the redistribution substrate 100. The second semiconductor chip 202 may be horizontally (e.g., in a direction parallel to a top surface 100a of the redistribution substrate 100) spaced apart from the first semiconductor chip 201. The first semiconductor chip 201 may be a memory chip, a logic chip, or a sensing chip, but the inventive concept is not limited to this example. The second semiconductor chip 202 may be a memory chip, a logic chip, or a sensing chip, but the inventive concept is not limited to this example. Each of the first and second semiconductor chips 201 and 202 may include the chip pads 210 provided thereunder. The chip pads 210 of the first semiconductor chip 201 may be electrically connected to integrated circuits of the first semiconductor chip 201 through interconnection lines of the first semiconductor chip 201. The chip pads 210 of the second semiconductor chip 202 may be electrically connected to integrated circuits of the second semiconductor chip 202 through interconnection lines of the second semiconductor chip 202.

The connection terminals 250 may be provided on the pad structure 160. The connection terminals 250 may be interposed between the first semiconductor chip 201 and the redistribution substrate 100 and between the second semiconductor chip 202 and the redistribution substrate 100. Each of the connection terminals 250 may be interposed between the pad structure 160 and the chip pad 210. The first and second semiconductor chips 201 and 202 may be electrically connected to the redistribution substrate 100 through each of the connection terminals 250.

An under-fill layer 320 may be provided in a gap region between the redistribution substrate 100 and the first semiconductor chip 201 and a gap region between the redistribution substrate 100 and the second semiconductor chip 202. The under-fill layer 320 may be provided to hermetically seal the connection terminal 250. The under-fill layer 320 may be formed of or include at least one of insulating polymers (e.g., epoxy-based polymers).

The mold layer 300 may be provided on the redistribution substrate 100. The mold layer 300 may cover the top surface 100a of the redistribution substrate 100, the first semiconductor chip 201, and the second semiconductor chip 202.

Figure 18:
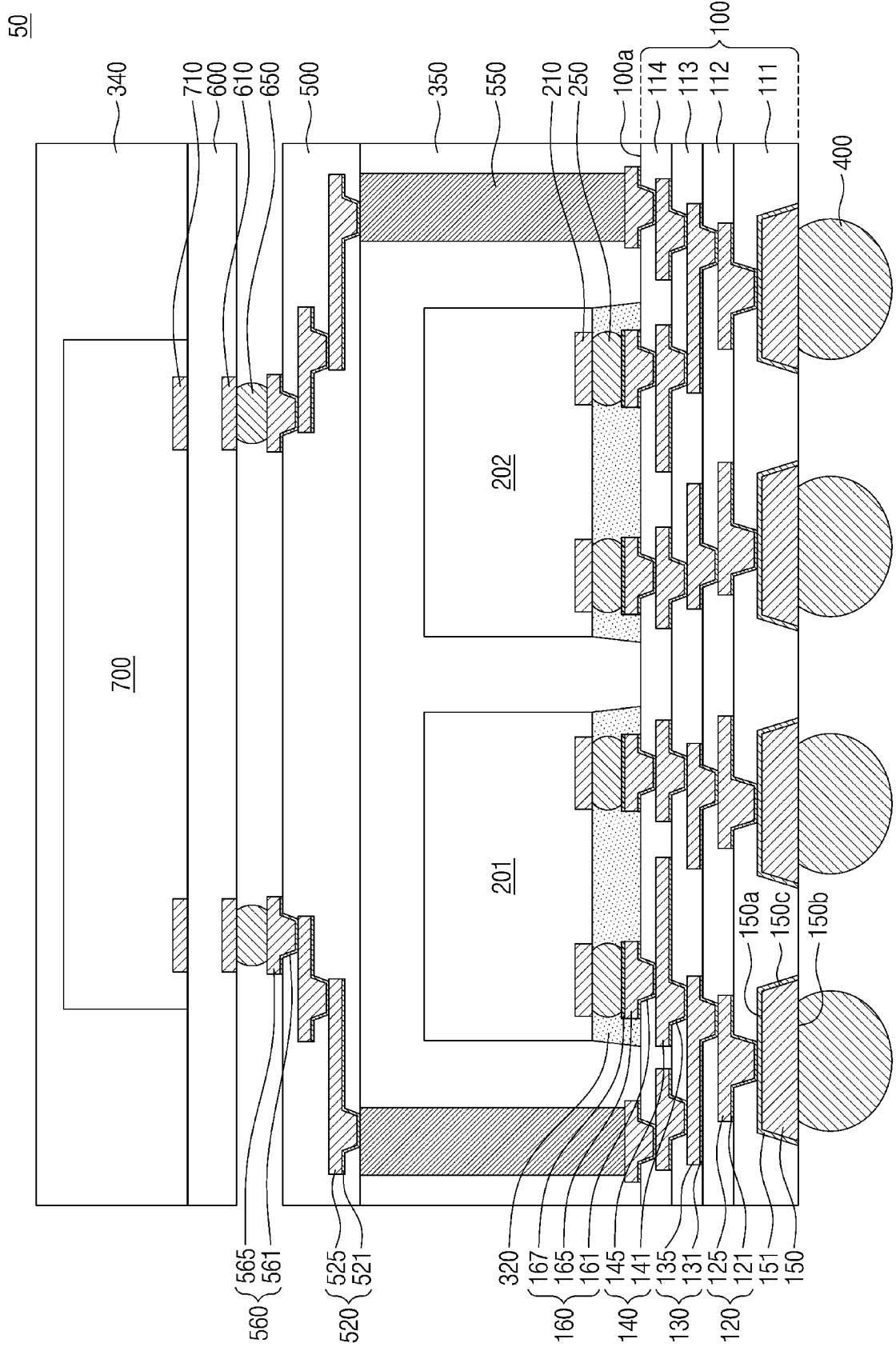
FIG. 18 is a sectional view illustrating a semiconductor package according to an embodiment of the inventive concept.

FIG. 18 is a sectional view illustrating a semiconductor package according to an embodiment of the inventive concept. For concise description, a previously described element may be identified by the same reference number without repeating an overlapping description thereof.

Referring to FIG. 18, a semiconductor package 50 may include the redistribution substrate 100, the first semiconductor chip 201, the second semiconductor chip 202, the connection terminal 250, the outer terminal 400, the conductive structure 550, the upper redistribution layer 500, the upper redistribution patterns 520, the upper pad structures 560, the upper terminal 650, and an upper package. The redistribution substrate 100 may include the first to fourth insulating layers 111, 112, 113, and 114, the first to third redistribution patterns 120, 130, and 140, the under-bump pattern 150, the protection pattern 151, and the pad structure 160. The redistribution substrate 100 and the outer terminal 400 may be configured to be substantially the same as those described with reference to FIGS. 1 and 2. The conductive structure 550, the upper redistribution layer 500, the upper redistribution pattern 520, and the upper pad structure 560 may be configured to be substantially the same as those described with reference to FIG. 15. The upper package may include the upper substrate 600, the upper semiconductor chip 700, and the upper mold layer 340. The upper package and the upper terminal 650 may be configured to be substantially the same as those described with reference to FIG. 16. The first semiconductor chip 201, the second semiconductor chip 202, the connection terminal 250, and the under-fill layer 320 may be configured to be substantially the same as those described with reference to FIG. 17.

Figure 19:
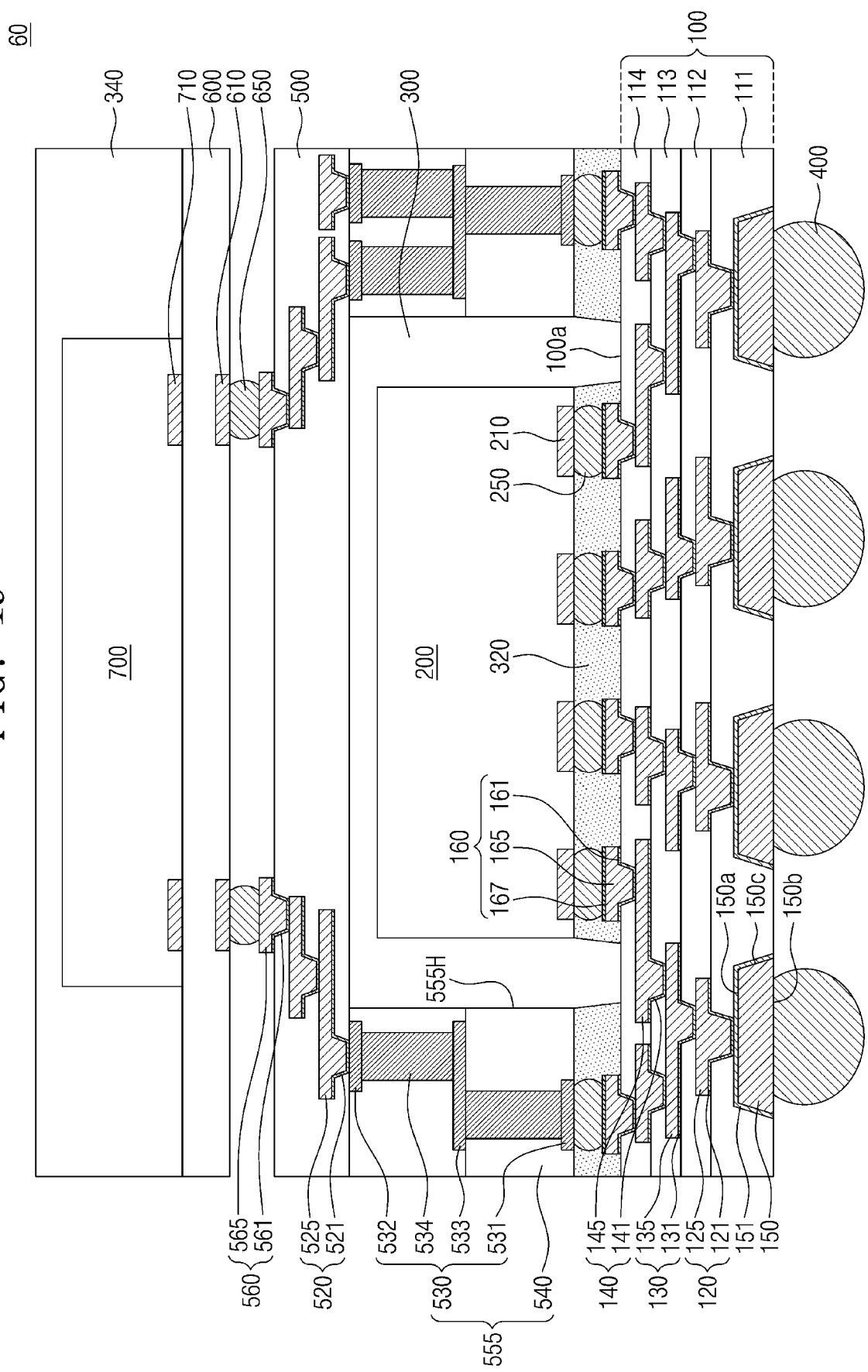
FIG. 19 is a sectional view illustrating a semiconductor package according to an embodiment of the inventive concept.

FIG. 19 is a sectional view illustrating a semiconductor package according to an embodiment of the inventive concept. For concise description, a previously described element may be identified by the same reference number without repeating an overlapping description thereof.

Referring to FIG. 19, a semiconductor package 60 may further include a connection substrate 555, in addition to the redistribution substrate 100, the semiconductor chip 200, the connection terminal 250, the outer terminal 400, the upper redistribution layer 500, the upper redistribution patterns 520, the upper pad structures 560, the upper terminal 650, and the upper package. The redistribution substrate 100 may include the first to fourth insulating layers 111, 112, 113, and 114, the first to third redistribution patterns 120, 130, and 140, the under-bump pattern 150, the protection pattern 151, and the pad structure 160. The redistribution substrate 100, the semiconductor chip 200, and the outer terminal 400 may be configured to be substantially the same as those described with reference to FIGS. 1 and 2. The upper redistribution layer 500, the upper redistribution pattern 520, and the upper pad structure 560 may be configured to be substantially the same as those described with reference to FIG. 15. The upper package may include the upper substrate 600, the upper semiconductor chip 700, and the upper mold layer 340. The upper package and the upper terminal 650 may be configured to be substantially the same as those described with reference to FIG. 16.

The connection substrate 555 may be disposed on the redistribution substrate 100. A connection hole 555H may be provided to penetrate the connection substrate 555. As an example, the connection substrate 555 may be manufactured by forming the connection hole 555H in a printed circuit board (PCB). When viewed in a plan view, the connection hole 555H may be formed in a center region of the connection substrate 555. The connection substrate 555 may include a connection structure 530 and a base layer 540. The base layer 540 may include a single layer or a plurality of stacked layers. The base layer 540 may be formed of or include at least one of insulating materials and may include, for example, carbon-based materials (e.g., graphite or graphene), ceramics, or polymeric materials (e.g., nylon, polycarbonate, or polyethylene). The connection hole 555H may be provided to penetrate the base layer 540.

The connection structure 530 may be provided on the top surface 100a of the redistribution substrate 100 and may be coupled to a corresponding one of the pad structures 160. The connection structure 530 may be provided in the base layer 540. The connection structure 530 may be disposed to be spaced apart from the semiconductor chip 200. The connection structure 530 may be electrically connected to the redistribution substrate 100. Accordingly, the connection structure 530 may be electrically connected to the semiconductor chip 200 or the outer terminal 400 through the redistribution substrate 100. As an example, the connection structure 530 may be formed of or include at least one of conductive metallic materials (e.g., copper (Cu), aluminum (Al), tungsten (W), titanium (Ti), stainless steel (SUS), iron (Fe), and alloys thereof).

The connection structure 530 may include a first pad 531, a second pad 532, a third pad 533, and vias 534. The first pad 531 may be provided near a bottom surface of the connection substrate 555 and may be exposed to the outside of the connection substrate 555. The third pad 533 may be interposed between the base layers 540. The via 534 may be provided to penetrate the base layers 540 and may be coupled to the third pad 533. The second pad 532 may be provided near a top surface of the connection substrate 555 and may be coupled to one of the vias 534. The second pad 532 may be electrically connected to the first pad 531 through the via 534 and the third pad 533. In an embodiment, the second pad 532 may not be vertically aligned to the first pad 531.

The semiconductor chip 200 may be provided in the connection hole 555H of the connection substrate 555. The providing of the semiconductor chip 200 may be performed before or after disposing the connection substrate 555.

The connection terminals 250 may be provided on the pad structure 160. The connection terminals 250 may be interposed between the semiconductor chip 200 and the redistribution substrate 100 and between the connection substrate 555 and the redistribution substrate 100.

The under-fill layer 320 may be provided in a gap region between the redistribution substrate 100 and the semiconductor chip 200 and a gap region between the redistribution substrate 100 and the connection substrate 555. The under-fill layer 320 may be provided to hermetically seal the connection terminal 250.

The mold layer 300 may be provided on the top surface 100a of the redistribution substrate 100 to fill the connection hole 555H. The mold layer 300 may be provided to fill a gap between the semiconductor chip 200 and the connection substrate 555 and to cover the semiconductor chip 200. In this case, the semiconductor chip 200 may be fastened to the connection substrate 555 by the mold layer 300. The mold layer 300 may be formed of or include at least one of insulating polymers (e.g., epoxy-based polymers). As an example, the mold layer 300 may include an adhesive insulating film (e.g., an Ajinomoto build-up film (ABF)).

Figure 20:
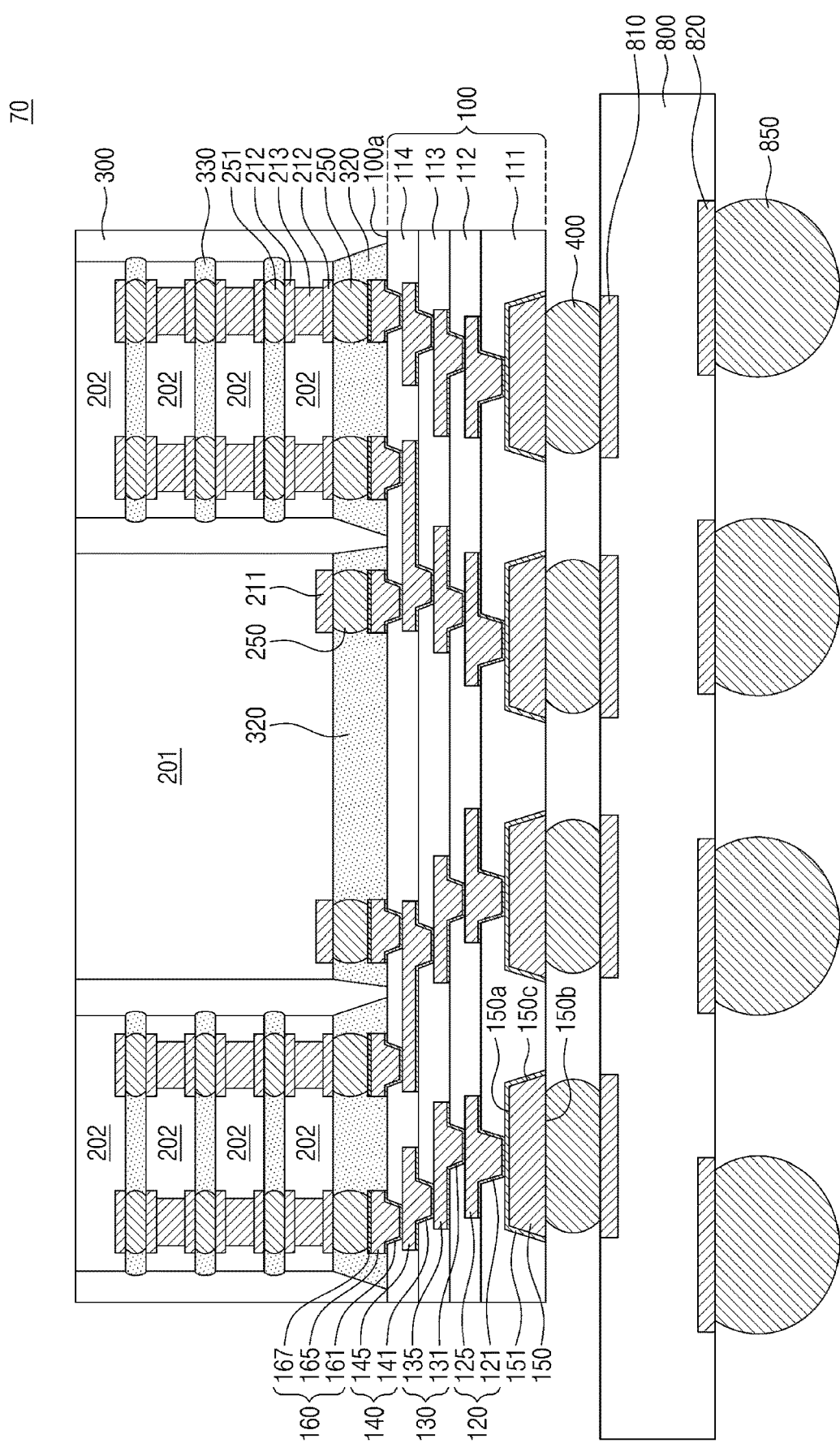
FIG. 20 is a sectional view illustrating a semiconductor package according to an embodiment of the inventive concept.

FIG. 20 is a sectional view illustrating a semiconductor package according to an embodiment of the inventive concept. For concise description, a previously described element may be identified by the same reference number without repeating an overlapping description thereof.

Referring to FIG. 20, a semiconductor package 70 may further include a package substrate 800, the first semiconductor chip 201, and the second semiconductor chip 202, in addition to the redistribution substrate 100 and the outer terminal 400.

The package substrate 800 may be provided. For example, the package substrate 800 may be a printed circuit board (PCB). The package substrate 800 may include conductive pads 810 and terminal pads 820. The conductive pads 810 may be adjacent to a top surface of the package substrate 800, and the terminal pads 820 may be adjacent to a bottom surface of the package substrate 800. The conductive pads 810 may be exposed to the outside of the package substrate 800 near the top surface of the package substrate 800. The terminal pads 820 may be exposed to the outside of the package substrate 800 near the bottom surface of the package substrate 800. The conductive pads 810 and the terminal pads 820 may be formed of or include at least one of conductive metallic materials (e.g., copper (Cu), aluminum (Al), tungsten (W), and titanium (Ti)).

Conductive terminals 850 may be provided on the bottom surface of the package substrate 800. The conductive terminals 850 may be provided in the form of at least one of solder balls, solder pillars, and solder bumps. The conductive terminals 850 may be formed of or include at least one of conductive metallic materials (e.g., tin (Sn), lead (Pb), nickel (Ni), gold (Au), silver (Ag), copper (Cu), aluminum (Al), and bismuth (Bi)). The conductive terminals 850 may serve as outer terminals. The conductive terminals 850 may be coupled to an external device (not shown).

The redistribution substrate 100 may be disposed on the package substrate 800. For example, the redistribution substrate 100 may serve as an interposer substrate. The redistribution substrate 100 may include the first to fourth insulating layers 111, 112, 113, and 114, the first to third redistribution patterns 120, 130, and 140, the under-bump pattern 150, the protection pattern 151, and the pad structure 160. The outer terminal 400 may serve as a connection terminal electrically connecting the package substrate 800 to the redistribution substrate 100. The redistribution substrate 100 and the outer terminal 400 may be configured to be substantially the same as those described with reference to FIGS. 1 and 2.

The first semiconductor chip 201 may be mounted on the top surface 100*a* of the redistribution substrate 100. The first semiconductor chip 201 may include a logic chip, a buffer chip, or a system-on-chip (SOC). For example, the first semiconductor chip 201 may be an application specific integrated circuit (ASIC) chip or an application processor (AP) chip. The ASIC chip may include an application specific integrated circuit (ASIC). The first semiconductor chip 201 may include a central processing unit (CPU) or a graphics processing unit (GPU).

A plurality of second semiconductor chips 202 may be mounted on the top surface 100*a* of the redistribution substrate 100. The second semiconductor chips 202 may be horizontally (e.g., in a direction parallel to a top surface 100*a* of the redistribution substrate 100) spaced apart from the first semiconductor chip 201. The second semiconductor chips 202 may be vertically (e.g., in the third direction) stacked on the redistribution substrate 100 to form chip stacks. In an embodiment, a plurality of the chip stacks may be provided. The second semiconductor chips 202 may be of a kind different from the first semiconductor chip 201. The second semiconductor chips 202 may be memory chips. The memory chips may include high bandwidth memory (HBM) chips. For example, the second semiconductor chips 202 may include DRAM chips. However, although not illustrated, the numbers of the chip stack, the first semiconductor chip 201, and the second semiconductor chips 202 may be variously changed.

The first semiconductor chip 201 may include first chip pads 211 which are provided near a bottom surface thereof. The second semiconductor chips 202 may include second chip pads 212 and chip vias 213. The second chip pads 212 may be disposed near top and bottom surfaces of the second semiconductor chip 202. The chip vias 213 may be disposed in the second semiconductor chip 202 and may be coupled to the second chip pads 212. However, the second chip pads 212 may not be provided on a top surface of the uppermost one of the second semiconductor chips 202, and the chip vias 213 may not be provided in the uppermost one of the second semiconductor chips 202. Each of the first and second chip pads 211 and 212 may be electrically connected to a corresponding one of the pad structures 160 of the redistribution substrate 100. The first and second chip pads 211 and 212 may be formed of or include at least one of conductive metallic materials (e.g., copper (Cu), aluminum (Al), tungsten (W), and titanium (Ti)).

Upper bumps 251 may be interposed between two adjacent ones of the second semiconductor chips 202. The upper bumps 251 may be electrically connected to the chip vias 213 of a corresponding one of the second semiconductor chips 202. The second semiconductor chips 202 may be electrically connected to each other by the upper bumps 251.

An upper under-fill layer 330 may be interposed between two adjacent ones of the second semiconductor chips 202. The upper under-fill layer 330 may be provided to fill a space between the upper bumps 251 and to hermetically seal the upper bumps 251. For example, the upper under-fill layer 330 may include a non-conductive film (NCF) (e.g., Ajinomoto build-up film (ABF)).

The connection terminals 250 may be interposed between the redistribution substrate 100 and the first semiconductor chip 201 and between the redistribution substrate 100 and the lowermost one of the second semiconductor chips 202. The redistribution substrate 100 may be electrically connected to the first semiconductor chip 201 through the connection terminals 250, and the redistribution substrate 100 may be electrically connected to the lowermost one of the second semiconductor chips 202 through the connection terminals 250. Each of the first and second chip pads 211 and 212 may be electrically connected to a corresponding one of the pad structures 160 through a corresponding one of the connection terminals 250. The connection terminals 250 may be formed of or include at least one of conductive metallic materials and may be provided in the form of at least one of solder balls, solder bumps, and solder pillars. A pitch of the connection terminals 250 in the horizontal direction may be smaller than a pitch of the conductive terminals 850 in the horizontal direction.

The under-fill layer 320 may be interposed between the redistribution substrate 100 and the first semiconductor chip 201 and between the redistribution substrate 100 and the second semiconductor chip 202. The under-fill layer 320 may be provided to fill a space between the connection terminals 250 and to hermetically seal the connection terminals 250. In an embodiment, the under-fill layer 320 may include a non-conductive film (NCF) (e.g., Ajinomoto build-up film (ABF)).

The mold layer 300 may be provided on the redistribution substrate 100. The mold layer 300 may cover the top surface 100*a* of the redistribution substrate 100, a side surface of the first semiconductor chip 201, and side surfaces of the second semiconductor chips 202. In an embodiment, the mold layer 300 may be provided to expose a top surface of the first semiconductor chip 201 and a top surface of the uppermost one of the second semiconductor chips 202. The mold layer 300 may be formed of or include an insulating polymer (e.g., epoxy molding compound (EMC)).

According to an embodiment of the inventive concept, a semiconductor package may include an under-bump pattern having a tapered shape. For example, in the under-bump pattern, a width of a top surface may be smaller than a width of a bottom surface. In addition, the semiconductor package may include a protection pattern covering the top and side surfaces of the under-bump pattern. According to an embodiment of the inventive concept, since the under-bump pattern is provided to have a decreasing width with decreasing distance from a top surface thereof, the protection pattern may improve contact and adhesion with the side surfaces of the under-bump pattern. In addition, due to the protection pattern, it may be possible to increase an adhesion strength between the protection pattern and an insulating layer at an interface between the protection pattern and the insulating layer. Accordingly, it may be possible to reduce or prevent an occurrence of a delamination or crack issue at an interface between the under-bump pattern and the protection pattern and/or between the protection pattern and the insulating layer. Furthermore, due to the protection pattern, it may be possible to prevent an oxide layer from being formed on the surface of the under-bump pattern. Thus, it may be possible to realize a semiconductor package with improved reliability and a method of fabricating the same.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor package, comprising:
a redistribution substrate extending in a first direction and a second direction perpendicular to the first direction;
a semiconductor chip mounted on a top surface of the redistribution substrate; and
an outer terminal on a bottom surface of the redistribution substrate,
wherein the redistribution substrate comprises:
an under-bump pattern;
a redistribution insulating layer covering a top surface and a side surface of the under-bump pattern;
a protection pattern interposed between the top surface of the under-bump pattern and the redistribution insulating layer, and interposed between the side surface of the under-bump pattern and the redistribution insulating layer; and
a redistribution pattern on the under-bump pattern,
wherein the outer terminal is disposed on a bottom surface of the under-bump pattern,
wherein a level of a top surface of the protection pattern on the top surface of the under-bump pattern is higher than a level of a bottom surface of the redistribution insulating layer, and
wherein the top surface of the protection pattern contacts the redistribution insulating layer and the redistribution pattern.

2. The semiconductor package of claim 1, wherein a width of the top surface of the under-bump pattern in the first direction is smaller than a width of the bottom surface of the under-bump pattern in the first direction.

3. The semiconductor package of claim 1, wherein the protection pattern is provided to expose the bottom surface of the under-bump pattern, and
the protection pattern comprises a material different from the under-bump pattern.

4. The semiconductor package of claim 1, wherein the redistribution pattern comprises a seed pattern and a conductive pattern on the seed pattern,
the conductive pattern comprises a via portion and a wire portion on the via portion,
the wire portion has a long axis extending in the first direction, and
the via portion protrudes in a third direction perpendicular to the first direction and the second direction.

5. The semiconductor package of claim 1, wherein an angle between the bottom surface of the under-bump pattern and the side surface of the under-bump pattern has a value between 70° and 89°.

6. The semiconductor package of claim 1, wherein the protection pattern comprises at least one of Ti, TiN, TiO2, CrN, TiCN, and TiAlN.

7. The semiconductor package of claim 1, wherein a thickness of the protection pattern has a value between 50 nm and 400 nm.

8. The semiconductor package of claim 1, wherein an angle between the bottom surface of the under-bump pattern and the side surface of the under-bump pattern is an acute angle.

9. The semiconductor package of claim 1, wherein the under-bump pattern comprises Cu.

10. The semiconductor package of claim 1, wherein the redistribution insulating layer comprises a photosensitive polymer.

11. A semiconductor package, comprising:
a redistribution substrate extending in a first direction and a second direction perpendicular to the first direction;
a first semiconductor chip mounted on a top surface of the redistribution substrate;
an outer terminal on a bottom surface of the redistribution substrate,
wherein the redistribution substrate comprises:
an under-bump pattern, an angle between a bottom surface of the under-bump pattern and a side surface of the under-bump pattern being an acute angle;
a redistribution insulating layer covering a top surface and a side surface of the under-bump pattern;
a redistribution pattern on the under-bump pattern, the redistribution pattern comprising a via portion and a wire portion on the via portion;
a protection pattern interposed between the top surface of the under-bump pattern and the redistribution insulating layer, and interposed between the side surface of the under-bump pattern and the redistribution insulating layer; and
a pad structure on the redistribution pattern,
wherein a level of a top surface of the protection pattern on the top surface of the under-bump pattern is higher than a level of a bottom surface of the redistribution insulating layer, and
wherein the top surface of the protection pattern contacts the redistribution insulating layer and the redistribution pattern.

12. The semiconductor package of claim 11, wherein the protection pattern is in contact with the top and side surfaces of the under-bump pattern, and
the protection pattern is in contact with the redistribution insulating layer.

13. The semiconductor package of claim 11, wherein the under-bump pattern has a trapezoidal shape.

14. The semiconductor package of claim 11, further comprising a second semiconductor chip mounted on the redistribution substrate,
wherein the second semiconductor chip is spaced apart from the first semiconductor chip in the first direction.

15. The semiconductor package of claim 11, further comprising:
a conductive structure disposed on the redistribution substrate and spaced apart from the first semiconductor chip; and
a mold layer disposed on the redistribution substrate to cover the first semiconductor chip and a side surface of the conductive structure.

16. The semiconductor package of claim 11, further comprising:
a connection terminal interposed between the first semiconductor chip and the pad structure; and
a mold layer disposed on the redistribution substrate to cover the first semiconductor chip.

17. The semiconductor package of claim 11, wherein the angle between the bottom surface of the under-bump pattern and the side surface of the under-bump pattern has a value between 70° and 89°.

18. The semiconductor package of claim 11, wherein the under-bump pattern comprises Cu.

19. The semiconductor package of claim 11, wherein the redistribution insulating layer comprises a photosensitive polymer.

20. The semiconductor package of claim 11, wherein the protection pattern comprises at least one of Ti, TiN, TiO2, CrN, TiCN, and TiAlN.

* * * * *